US011599781B2

(12) United States Patent
Kumar et al.

(10) Patent No.: US 11,599,781 B2
(45) Date of Patent: Mar. 7, 2023

(54) LITHOGRAPHIC MEMRISTIVE ARRAY

(71) Applicant: Rain Neuromorphics Inc., San Francisco, CA (US)

(72) Inventors: Suhas Kumar, Mountain View, CA (US); Jack David Kendall, San Mateo, CA (US); Alexander Almela Conklin, San Jose, CA (US)

(73) Assignee: Rain Neuromorphics Inc., San Francisco, CA (US)

( * ) Notice: Subject to any disclaimer, the term of this patent is extended or adjusted under 35 U.S.C. 154(b) by 0 days.

(21) Appl. No.: 17/354,829

(22) Filed: Jun. 22, 2021

(65) Prior Publication Data

US 2021/0406656 A1 Dec. 30, 2021

Related U.S. Application Data

(60) Provisional application No. 63/088,325, filed on Oct. 6, 2020, provisional application No. 63/044,104, filed on Jun. 25, 2020.

(51) Int. Cl.
| | |
|---|---|
| *G06N 3/063* | (2006.01) |
| *H01L 45/00* | (2006.01) |
| *H01L 27/24* | (2006.01) |
| *G06N 3/04* | (2023.01) |
| *G11C 11/54* | (2006.01) |
| *G11C 13/00* | (2006.01) |

(52) U.S. Cl.
CPC ............ *G06N 3/063* (2013.01); *G06N 3/04* (2013.01); *G11C 11/54* (2013.01); *G11C 13/0007* (2013.01); *G11C 13/0069* (2013.01); *H01L 27/249* (2013.01); *H01L 45/08* (2013.01); *H01L 45/16* (2013.01)

(58) Field of Classification Search
CPC .............................. G06N 3/063; H01L 27/249
See application file for complete search history.

(56) References Cited

U.S. PATENT DOCUMENTS

| | | | |
|---|---|---|---|
| 9,691,479 B1 * | 6/2017 | Merced Grafals | ......................... G11C 13/0069 |
| 2014/0312296 A1 | 10/2014 | Jo | |
| 2015/0019468 A1 | 1/2015 | Nugent | |
| 2018/0277552 A1 | 9/2018 | Huang | |
| 2019/0311018 A1 | 10/2019 | Kendall | |

(Continued)

*Primary Examiner* — Moazzam Hossain
(74) *Attorney, Agent, or Firm* — Van Pelt, Yi & James LLP

(57) ABSTRACT

A memristive device is described. The memristive device includes a first layer having a first plurality of conductive lines, a second layer having a second plurality of conductive lines, and memristive interlayer connectors. The first and second layers differ. The first and second pluralities of conductive lines are each lithographically defined. The first and second pluralities of conductive lines are insulated from each other. The memristive interlayer connectors are memristively coupled with a first portion of the first plurality of conductive lines and memristively coupled with a second portion of the second plurality of conductive lines. The memristive interlayer connectors are thus sparsely coupled with the first and second pluralities of conductive lines. Each memristive interlayer connector includes a conductive portion and a memristive portion. The memristive portion is between the conductive portion and corresponding line(s) of the first plurality of conductive lines and/or the second plurality of conductive lines.

19 Claims, 17 Drawing Sheets

(56) References Cited

U.S. PATENT DOCUMENTS

2020/0066340 A1* 2/2020 Sharma ............... H01L 45/1641
2021/0257411 A1* 8/2021 Kendall ................ H01L 45/16

* cited by examiner

LITHOGRAPHIC MEMRISTIVE ARRAY

CROSS REFERENCE TO OTHER APPLICATIONS

This application claims priority to U.S. Provisional Patent Application No. 63/044,104 entitled MEMRISTIVE ARRAY HAVING FLOATING ELECTRODES filed Jun. 25, 2020 and U.S. Provisional Patent Application No. 63/088,325 entitled SPARSE NEURAL ARRAY filed Oct. 6, 2020, both of which are incorporated herein by reference for all purposes.

BACKGROUND OF THE INVENTION

Matrix multiplications are utilized in a variety of computing applications. For example, multiple layers of vector-matrix multiplication operations may be performed by multiple layers of crossbar arrays. In such an application, input signals form the input vector that is provided to the inputs of the crossbar array. The input signals may be data for a still image, video image frames and/or other information. The input signals are multiplied by a matrix of weights. The matrix of weights is provided by resistances at the crossings between the inputs and outputs. In a crossbar array, each input is connected to all of the outputs (i.e. is fully connected). The outputs signals are the result of the vector-matrix multiplication operations on the input signals and form the output vector. The output vector may be provided as an input vector to a next crossbar array. This progression continues until processing is completed. Thus, the output of the final crossbar array is the output of the system. Such a vector-matrix multiplication carried out by a crossbar array may also be performed in neural networks. In such a case, the inputs to the crossbar are input neurons, while the output to the crossbar may be output neurons. Multiple crossbar arrays can also be used in a neural network application. In such a case, inputs to the first crossbar array are input neurons. The outputs for the last crossbar array are to output neurons.

Memristors can provide the resistances, or weights, between the inputs and outputs of a crossbar array. A memristor has a resistance that can depend upon previous currents through or voltage driven across the device. Thus, the memristor provides a programmable weight for the crossbar array. For example, the crossbar array includes a first set of parallel metal lines and a second set of parallel metal lines in two different layers of a device. The metal lines in the first set are nominally perpendicular to the metal lines in the second set. Memristors provide connections between the first set of parallel lines and the second set of parallel lines at the locations at which the lines cross. Although such arrays are utilized, what is desired is an improved mechanism for performing computing operations, such as matrix multiplications.

BRIEF DESCRIPTION OF THE DRAWINGS

Various embodiments of the invention are disclosed in the following detailed description and the accompanying drawings.

DETAILED DESCRIPTION

Figure 1A:
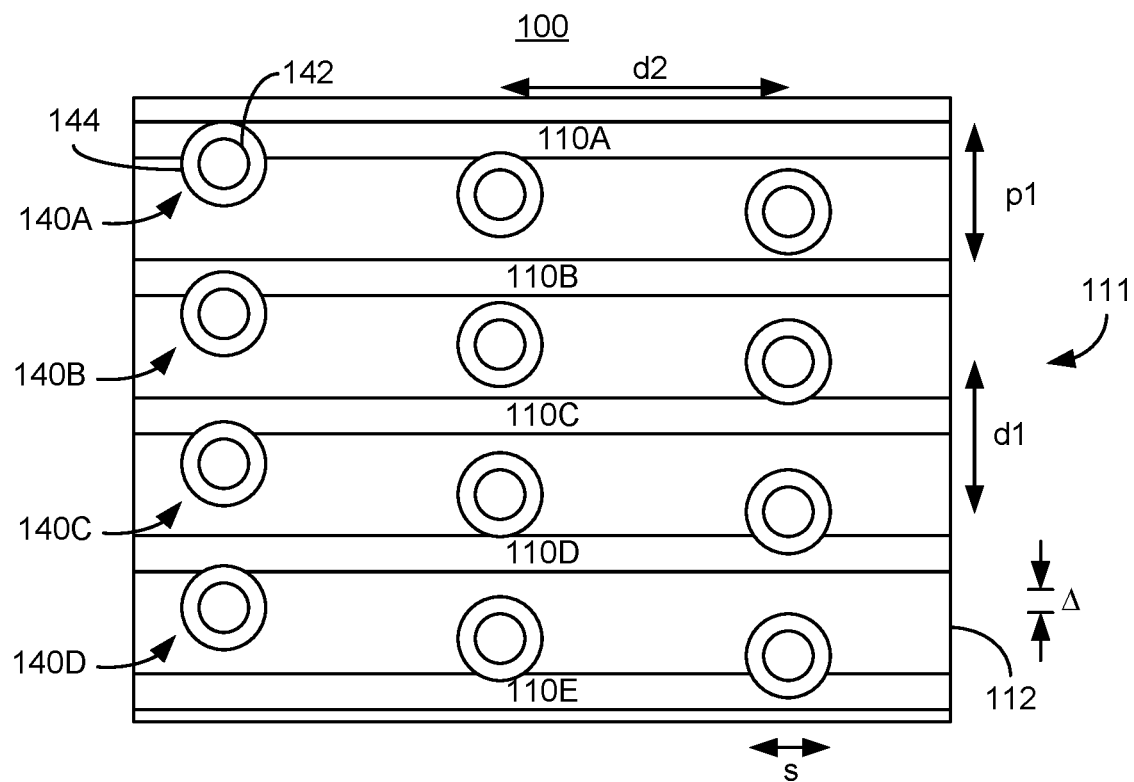
FIGS. 1A-1D depict portions of embodiments of memristive devices.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Crossbar arrays are used in a variety of applications, such as vector-matrix multiplications. A memristor, which has a resistance that can depend upon previous voltages across the device or the currents through the device, can be used to provide a programmable weight in a crossbar array. When used as programmable weights, a memristor is at each connection. Crossbar arrays are also typically densely connected. Stated differently, all available connections are made between the inputs and outputs of the crossbar array. Such densely connected networks are regular in nature, may be expensive and complicated to design, construct and operate, may consume a relatively large amount of area, and may be challenging to scale.

A memristive device including multiple layers of sparsely coupled conductive lines is disclosed. For example, the memristive device has at least a first layer and a second layer. The first layer includes a first plurality of conductive lines that is lithographically defined. The second layer differs from the first layer and includes a second plurality of conductive lines. The second plurality of conductive lines is insulated from the first plurality of conductive lines. The second plurality of conductive lines is also lithographically defined. The memristive interlayer connectors are memristively coupled with a first portion of the first plurality of conductive lines and memristively coupled with a second portion of the second plurality of conductive lines. The memristive interlayer connectors are, therefore, sparsely coupled with the first plurality of conductive lines and sparsely coupled with the second plurality of conductive lines. Each memristive interlayer connector has a conductive portion and a memristive portion. The memristive portion is between the conductive portion and corresponding line(s) of the first plurality of conductive lines and/or of the second plurality of conductive lines. In some embodiments, the first and/or second plurality of conductive lines are floating.

Thus, the memristive device may be sparsely connected. A sparsely connected network is one in which not all possible or available connections between the inputs and outputs of the network are made. Thus, the memristive device may be utilized in applications, such as neural networks, in which sparse connectivity results in improved performance, scaling and/or compression. By selecting the geometries of the conductive lines in the first and second layers as well as the layout of the memristive interlayer connectors, the density of connections may be tailored. Further, although the components of the memristive device can be fabricated in a deterministic manner (e.g. lithographically), the connections may be stochastic in nature. Because the individual layers and memristive interlayer connectors can be lithographically defined, the (somewhat randomly connected) memristive devices may also be repeatably fabricated. Consequently, fabrication and performance of such memristive devices may be improved.

The conductive portion of the memristive interlayer connector may be a conductive pillar having a sidewall. In some such embodiments, the memristive portion surrounds at least a portion of the sidewall. In some embodiments, the first and/or second plurality of conductive lines is coupled to the memristive interlayer connectors by a conductive branch structure. In some such embodiments, the memristive portion of each memristive interlayer connector includes a memristive layer in proximity to the conductive branch structure.

In some embodiments, the first plurality of conductive lines has a first long axis oriented in a first direction and the second plurality of conductive lines has a second long axis oriented in a second direction. The first direction is at a nonzero acute angle from the second direction. Because of the locations of the memristive interlayer connectors and the geometries of the first and second plurality of lines, the memristive connectors are sparsely connected to the first and second plurality of conductive lines. In some embodiments, each conductive line of the first and/or second plurality of conductive lines includes a line segments having long axes oriented in a plurality of directions. In some embodiments, each conductive line of the first and/or second plurality of conductive lines includes non-linear sections. Thus, the conductive lines form non-periodic and/or irregular network(s).

In some embodiments, the first plurality of conductive lines has a first connectivity and the second plurality of conductive lines has a second connectivity. The memristive device has a third connectivity less than the first connectivity and less than the second connectivity. In some embodiments, therefore, not only are the conductive lines in each layer sparsely connected to the memristive interlayer connectors, but the connectivity of the memristive device is lower than the connectivity of one of its layers.

In some embodiments, the memristive device also includes conductive interlayer connectors. These conductive interlayer connectors may correspond to the memristive interlayer connectors. For example, the memristive and conductive interlayer connectors may occur in pairs. The conductive interlayer connectors are electrically connected to a third portion of the first plurality of conductive lines and are electrically connected to a fourth portion of the second plurality of conductive lines. Thus, the conductive interlayer connectors may also be sparsely connected to the conductive lines in the first and/or second layers. The memristive device may also include input neurons and output neurons. The input neurons may be connected to the conductive interlayer connectors, while the output neurons are connected to the memristive interlayer connectors. In some such embodiments, the conductive lines in the first and/or second layers that are connected to the memristive and conductive interlayer connectors may form clusters.

A neural network is also described. The neural network includes a first layer including a first plurality of lithographically-defined conductive lines, a second layer including a second plurality of lithographically-defined conductive lines, memristive interlayer connectors, and neurons coupled to the memristive interlayer connectors. In some embodiments, the second layer may be omitted. The first and second layers are analogous to those described with respect to the memristive device. Similarly, the memristive interlayer connectors are analogous to those described with the memristive device. Consequently, in some embodiments, the first and/or second plurality of conductive lines are floating. In some embodiments, the neural network includes conductive interlayer connectors. These conductive interlayer connectors are analogous to those described in the context of the memristive device. Thus, in some embodiments, individual memristive connections between conductive lines and memristive interlayer connectors are individually addressable. In some such embodiments, the conductive lines in the first and/or second layers that are connected to the memristive and conductive interlayer connectors may form clusters.

A method of providing a memristive device is also described. The method includes lithographically defining a first plurality of conductive lines in a first layer and lithographically defining a second plurality of conductive lines in a second layer. The second layer is different from the first layer. The second plurality of conductive lines are insulated from the first plurality of conductive lines. The method also includes providing memristive interlayer connectors coupled with a first portion of the first plurality of conductive lines and coupled with a second portion of the second plurality of conductive lines. The memristive interlayer connectors are sparsely coupled with the first plurality of conductive lines and sparsely coupled with the second plurality of conductive lines. Each memristive interlayer connector includes a conductive portion and a memristive portion between the conductive portion and corresponding line(s) of the first and/or second plurality of conductive lines. In some embodiments, the first and/or second plurality of conductive lines are floating.

In some embodiments, lithographically defining the first plurality of conductive lines further includes defining a first long axis oriented in a first direction for the first plurality of conductive lines. In such embodiments, lithographically defining the second plurality of conductive lines includes defining a second long axis oriented in a second direction. The first direction is at a nonzero acute angle from the second direction. In some embodiments, each conductive line of the first and/or second plurality of conductive lines includes line segments having long axes oriented in a plurality of directions.

In some embodiments, the method includes providing conductive interlayer connectors corresponding to the plurality of memristive interlayer connectors. The conductive interlayer connectors are electrically connected to a third portion of the first plurality of conductive lines and being electrically connected to a fourth portion of the second plurality of conductive lines. In some such embodiments, the method includes providing input and output neurons. The input neurons are coupled to at least some of the conductive interlayer connectors. The output neurons are coupled to at least some of the memristive interlayer connectors. Some of the first and/or second plurality of conductive lines may form clusters.

In some embodiments, a method includes accessing a first conductive line in a memristive device by applying a voltage to a conductive portion of a memristive interlayer connector. In some embodiments, memristive connections may be individually programmed by providing a voltage difference between the conductive portion of a memristive interlayer connector and a corresponding conductive interlayer connector.

A neural device is also described. The neural device includes at least one layer. The layer includes conductive lines that may be lithographically defined. The neural device also includes memristive interlayer connectors and conductive interlayer connectors corresponding to the memristive interlayer connectors. The memristive interlayer connectors are memristively coupled with a first portion of the conductive lines such that the memristive interlayer connectors are sparsely coupled with the plurality of conductive lines. Each memristive interlayer connector includes a conductive portion and a memristive portion between the conductive portion and corresponding line(s) of the first portion of the conductive lines. The conductive interlayer connectors are electrically connected to a second portion of the plurality of conductive lines. The neural device also includes input neurons and output neurons. The input neurons are coupled to at least a portion of the conductive interlayer connectors. The output neurons coupled to at least a portion of the memristive interlayer connectors. In some embodiments, the first portion of the conductive lines coupled to the memristive interlayer connectors include clusters of conductive lines. In some embodiments, therefor, the connections between the conductive lines, the conductive interlayer connectors and the memristive interlayer connectors form clusters. In some embodiments, the neural device includes multiple layers of conductive lines. In some such embodiments, the layers of conductive lines are configured in a manner analogous to the memristive device described herein.

Various configurations are described herein. Although particular combinations of configurations are shown, some or all of the aspects of such configurations may be provided separately and/or in combinations not explicitly discussed. For example, the types of conductive lines in a particular memristive device may include conductive lines from various embodiments (e.g. straight, curved, arbitrarily-shaped, including conductive branch structures, and/or formed of segments of a lattice) in one or more of the layers. Similarly, a particular device may include types of memristive interconnects from multiple embodiments (e.g. varying sizes, memristive shells, memristive layers, and/or memristive tabs) in one or more of the layers.

Figure 1B:
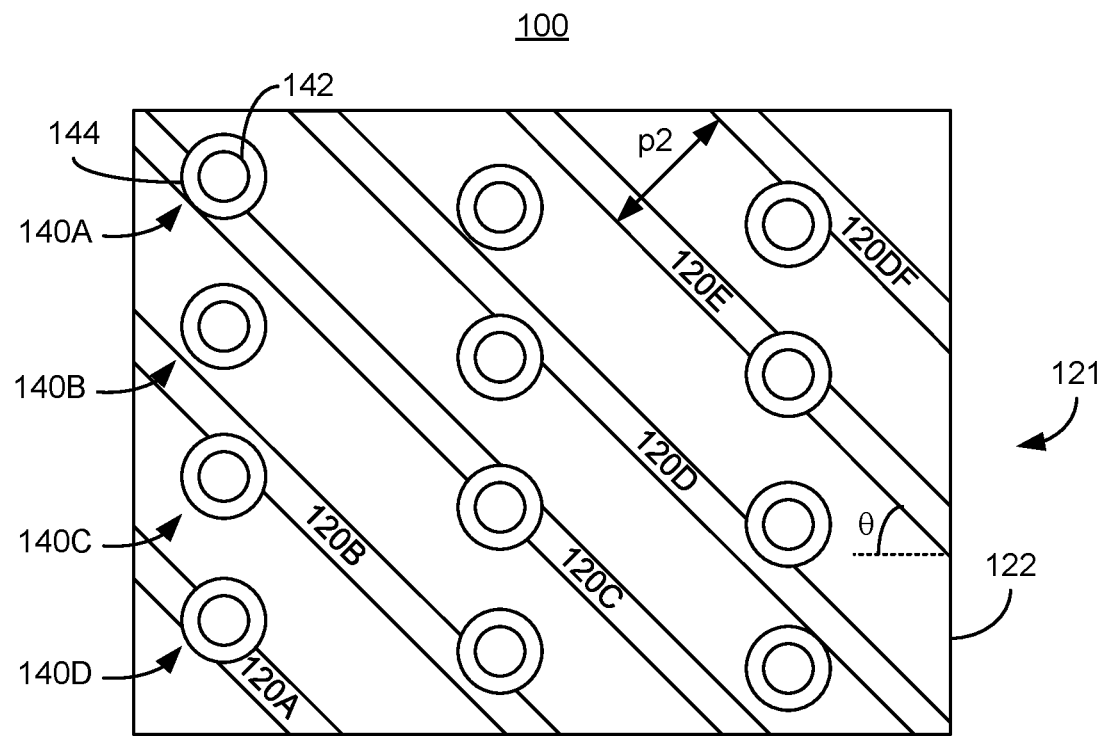
Figure 1C:
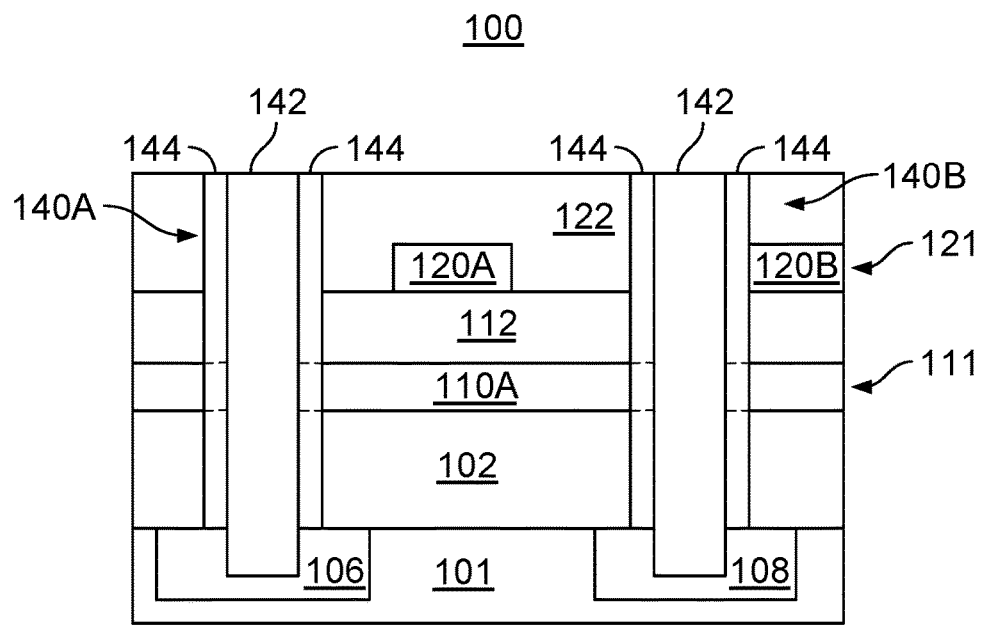
Figure 1D:
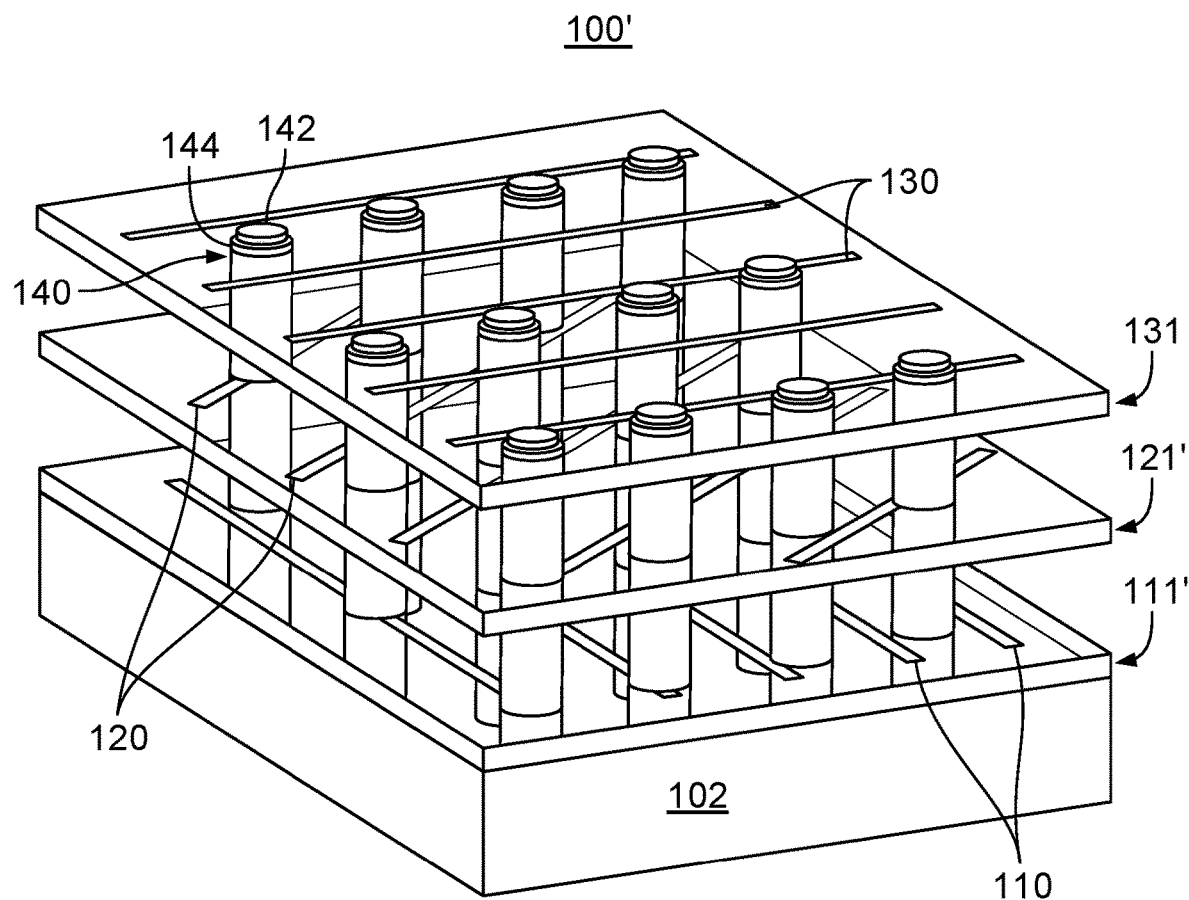

FIGS. 1A-1D depict portions of embodiments of memristive devices 100 and 100'. FIGS. 1A-1B depicts views of layers of memristive device 100. FIG. 1C is a cross-sectional view of a portion of memristive device 100. FIG. 1D depicts an embodiment of memristive device 100. For clarity, only a portion of memristive devices 100 and 100' are shown and FIGS. 1A-1D are not to scale or proportion. For simplicity, only some structures are labeled.

Referring to FIGS. 1A-1C memristive device includes an underlying substrate 101, in or on which devices 106 and 108 may be formed. For example, devices 106 and 108 may be neurons, such as CMOS neurons. In some embodiments, other and/or additional devices may be present. Although shown within substrate 101, devices 106 and 108 may be formed within, on and/or above substrate 101. Insulating layer 102 is shown on substrate 101.

Memristive device 100 includes layers 111 and 121 and memristive interlayer connectors. For simplicity, only four memristive interlayer connectors 140A, 140B, 140C, and 140D (collectively or generally memristive interlayer connectors 140) are labeled. As indicated in FIG. 1C, memristive interlayer connectors 140 penetrate and connect multiple layers 111 and 121. Memristive interlayer connectors may each include a conductive portion 142 and a memristive portion 144. For simplicity, only memristive interlayer connector 140A has conductive portion 142 and memristive portion 144 labeled. Memristive portion 144 may be a memristive material such as $HfO_x$, and/or $TiO_x$ (where x indicates various stoichiometries). Conductive portion 142 may be a metal or metal alloy, such as Cu, Al, and/or their alloys. In the embodiment shown, memristive interlayer connectors 140 are configured as vias. Thus, memristive portion 144 may form a shell around the sidewalls of conductive portion 142. Further, conductive portion 142 is formed as a pillar. However, in other embodiments, memristive interlayer connectors 140 may have other configurations. For example, the memristive material 144 may cover only a portion of the sidewalls of the conductive pillar 142. In the embodiment shown, interlayer connectors 140 are substantially perpendicular to layers 111 and 121. However, other angles are possible. In the embodiment shown, memristive interlayer connectors 140 have a pitch (distance between centers in the embodiment shown) d1 in one direction, a pitch d2 in a perpendicular direction, and an offset of Δ.

Memristive interlayer connectors 140 are also lithographically fabricated. For example, a mask having apertures aligned with the locations of memristive interlayer connectors 140 may be fabricated, an etch of the exposed structures to the desired depth performed, and the vias formed refilled with the memristive portion 144 and conductive portion 142. Thus, the locations, size, and shape of memristive interlayer connectors 140 are deterministically determined during fabrication.

Layer 111 includes conductive lines 110A, 110B, 110C, 110D and 110E (collectively or generically conductive line(s) 110). Similarly, layer 121 includes conductive lines 120A, 120B, 120C, 120D, 120E and 120F (collectively or generically conductive line(s) 120). Conductive lines 110 and 120 may be metal lines. For example, conductive lines 110 and/or 120 may be formed of Cu, Al, their alloys, another metal, and/or another metal alloy. Conductive lines 110 have a pitch p1 in layer 111. Conductive lines 120 have a pitch p2 in layer 121. Layers 111 and 121 also include insulators 112 and 114, respectively. Insulators 112 and 122 may be insulting dielectrics. For example, silicon dioxide may be used for insulators 112 and 122. In some embodiments, insulators 112 and/or 122 include a layer of silicon dioxide that is nominally two hundred nanometers thick (although the thickness may vary arbitrarily). In some embodiments, some of conductive lines 110 and/or 120 are connected to conductive lines in another layer via conductive interlayer connector(s) that do not include a memristive portion. In such an embodiment, such conductive lines may considered longer and to extend into multiple layers. In the embodiment shown, the long axis of conductive lines 120 are at a nonzero, acute angle θ from the direction of the long axis of conductive lines 110. In the embodiment shown, conductive lines 110 and 120 are floating (not directly electrically connected to another structure). In other embodiments, direct contact can be made to one or more of conductive line(s) 110 and/or 120. Thus, conductive line(s) 110 and/or 120 need not float. Further, although shown as and called "lines", conductive lines 110 and/or 120 may have an arbitrary shape including but not limited to incorporating line segments, curves, and/or loops.

Conductive lines 110 and 120 are also lithographically defined (e.g. fabricated). For example, a mask having apertures aligned with the locations of conductive lines 110 may be fabricated, a metal layer deposited, and the mask lifted off. Alternatively, a mask having apertures aligned with the locations of conductive lines 110 may be fabricated, an underlying insulating layer etched to form trenches or apertures in the insulator layer, the trenches/apertures filled with a metal and the mask lifted off. In other embodiments, a metal layer may be deposited, a mask covering regions corresponding to conductive lines 110 provided, and the exposed metal layer etched. Other techniques may be used to fabricate conductive lines 110. Conductive lines 120 may be formed in analogous manner(s). Thus, the locations, size, and shape of conductive lines 110 and 120 are deterministically determined during fabrication.

Conductive lines 110 and 120 are memristively connected to memristive interlayer connectors 140. Stated differently, conductive lines 110 and 120 are electrically connected to conductive portion 142 through memristive portion 144. This region of the memristive connection is generally shown by dotted lines within memristive portions 144 in FIG. 1C. Each pair of dotted lines encompassing an area sandwiched between conducting lines 110 or 120 and the metallic core 142 may be considered to form a single memristor. Although each memristive interlayer connector 140 is shown as being connected to zero or one conductive line 110 or 120 in a layer 111 or 121, a memristive interlayer connector 140 may be contacted by more than one conductive line in a given layer. Conductive lines 110 and 120 and memristive interlayer connectors 140 are configured such that layer 110 and 120 and memristive device 100 are sparsely connected. Stated differently, conductive lines 110 are sparsely and memristively connected to memristive interlayer connectors 140 and conductive lines 120 are sparsely and memristively connected to memristive interlayer connectors 140. A sparsely connected network is one in which not all possible or available connections between the inputs and outputs of the network are made. A sparsely connected network is opposed to a densely connected network (e.g. a crossbar array) in which all available connections are made between the inputs and outputs of the crossbar array. For example, conductive line 110A is electrically connected to (in physical contact with/touching in the view shown) only two of the three memristive interlayer connectors 140 closest to conductive line 110A. Similarly, conductive line 110B is electrically connected to only one memristive interlayer connector 140B. In some embodiments, the connectivity of may be indicated by the fraction of conductive lines in a layer (or device) connected to the interlayer connectors. Thus, if conductive lines 110 are connected to all memristive interlayer connectors 140, the connectivity is 1. Memristive device 100 may be so configured (i.e. may be densely connected). In some embodiments, the connectivity of memristive device 100 is lower than the connectivity of any of its layers (i.e. memristive device 100 is more sparsely connected than layer 111 and layer 121). In some embodiments, the sparsity of connectivity of memristive device 100 may be preserved for additional layers. For example, the introduction of another sparsely connected layer of conductive lines may not significantly lower (and/or may not raise) the density of connections in memristive device 100.

The sparse connectivity of conductive lines 110 with memristive interlayer connectors 140 may be made based on the locations, sizes and shapes of memristive interlayer connectors 140 and conductive lines 110 and 120. To achieve the sparse connectivity, the geometry of conductive lines 110 differs from the geometry of conductive lines 120. For example, conductive lines 120 provide a current path (e.g. a long axis) that is at an angle θ from the current path (e.g. long axis) for conductive lines 110. Other aspects of the geometries of layers 111 and 121 may differ. For example, for sparse connectivity, the pitches p1 and p2 may differ (or be the same), pitch p1 may vary across the plane of layer 111 while pitch p2 is constant, pitch p2 may vary across the plane of layer 121 while pitch p1 is constant, pitch p1 may vary in a different manner across the plane of layer 111 than pitch p2 varies across layer 121, the relative angle θ may vary, the widths of conductive lines 110 and/or 120 may vary, the length of conductive lines 110 and/or 120 may vary, the distance between memristive interlayer connectors 140 (d1 and/or d2) may vary, the offset A may vary and/or be selected for sparse connectivity, conductive lines 110 and/or 120 within a layer may not be parallel, the size s of memristive interlayer connectors 140 may vary and/or be tailored, and/or the shape of memristive interlayer connectors 140 may differ. In some embodiments, the shapes of conductive lines 110 and/or 120 may be randomized.

In addition to memristive device 100 and layers 111 and 121 being sparsely connected the connectivity of memristive device 100 may be made increasingly random by the addition of more layers. For example, FIG. 1D depicts a perspective view of memristive device 100'. Memristive device 100' is analogous to memristive device 100. Thus, memristive device 100 includes layers 111' and 121' having conductive lines 110 and 120, respectively, that are analogous to layers 111 and 121 having conductive lines 110 and 120, respectively. In addition, memristive interlayer connectors 140 having conductive portion 142 and memristive portion 144 are analogous to those of memristive device 100. Memristive device 100' also includes additional layer 131. Memristive device 100' thus includes conductive lines 130 in layer 131. Conductive lines 130 are perpendicular to conductive lines 110. Thus, conductive lines 130 are at a nonzero acute angle (π/2-θ) from conductive lines 120. Conductive lines 130 are also lithographically formed. The dimensions, location, pitch, thickness, width, length, shape material(s) used, and/or other features of conductive lines 130 are analogous to those of conductive lines 110 and/or 120. Conductive lines 130 are sparsely, memristively connected with memristive interlayer connectors 140 and, therefore, with conductive lines 110 and 120. Further, the connectivity between memristive interlayer connectors 140 and conductive lines 130 differs from the connectivity between memristive interlayer connectors 140 and lines 110 and/or 120. Additional layers of conductive lines (not shown) might also be added. In some embodiments the sparseness of memristive device 100 and/or 100' may be increased, decreased, or remain substantially with the addition of layers. In some embodiments, the randomness and/or irregularity of memristive device 100 and/or 100' may be increased, decreased, or remain the same with the addition of more layers.

In operation, memristive portions 144 of interlayer connectors 140 are programmed to the desired weight be driving a current through (i.e. placing a voltage across) memristive portions 144 of memristive interlayer connectors 140. Conductive lines 110 and 120 and/or conductive lines 110, 120 and 130 are electrically accessed by applying a voltage to the conductive portion 142 of corresponding memristive interlayer connector(s) 140. In some embodiments, some or all of conductive lines 110, 120, and/or 130 are floating. Such floating conductive lines 110, 120, and/or 130 accessible only through the corresponding memristive interlayer connector(s) 140. In some embodiments, memristive interlayer connector(s) 140 serve as control electrodes. In other embodiments, additional conductive interlayer connectors may be provided and used to access conductive lines 110, 120, and/or 130.

Memristive devices 100 and/or 100' may be used where programmable resistances are desired. Memristive devices 100 and/or 100' allow for networks that are complex, randomized, and/or sparsely connected to be formed lithographically and deterministically. Because each layer 111/111', 121/121' and 131 may be provided lithographically, the paths of conductive lines 110, 120, and 130 in each layer is known. Similarly, the locations and geometries of memristive interlayer connectors 140 are also predetermined. However, a memristive device including many layers may form a network that is more random in nature due to differences between layers. Consequently, benefits of sparse networks, such as improved modeling of biologic systems in neural networks, improved performance, and/or improved scaling, may be attained. Further, the fabrication of each layer in each device is simple and repeatable. Because of differences in the geometries of (repeatably fabricated) layers 111, 121, 131 and any subsequent layers, irregular (e.g. stochastic or randomized) networks may be formed. Multiple devices having the same irregular networks may be produced. Thus, the pattern of sparse connections within memristive devices 100 and 100' may be randomized, but repeatable. Consequently, performance of systems using memristive device(s) 100 and/or 100' may be improved.

Figure 2:
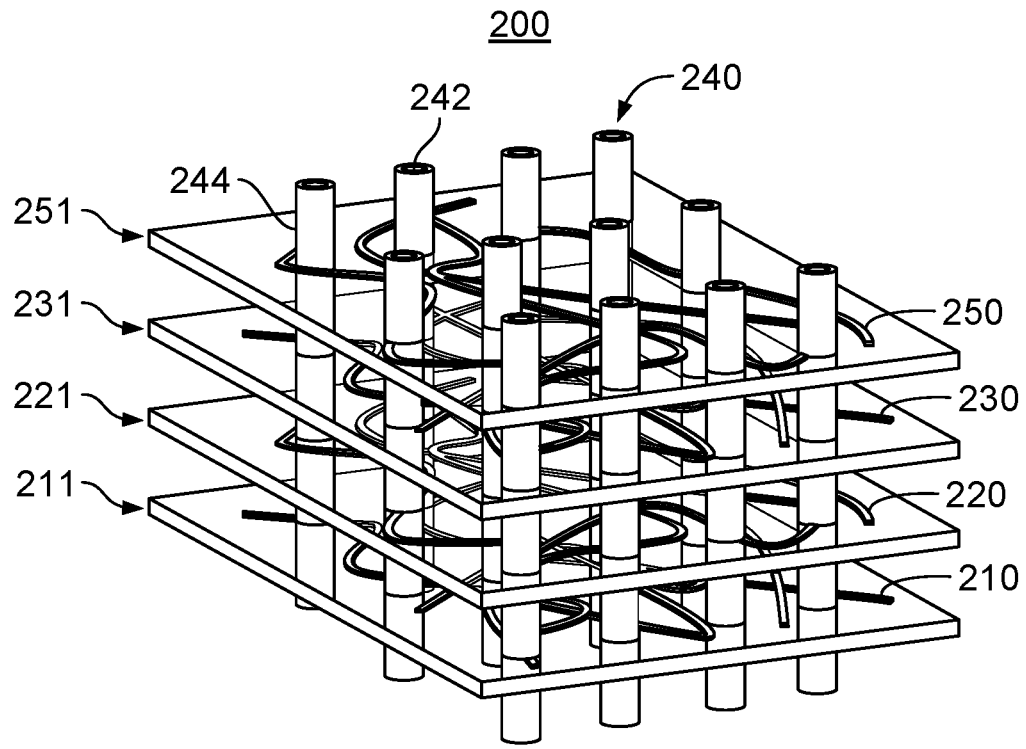
FIG. 2 depicts an embodiment of a portion of a memristive device.

FIG. 2 is a perspective view of a portion of an embodiment of memristive device 200. For clarity, only a portion of memristive device 200 is shown and FIG. 2 is not to scale. For simplicity, only some structures are labeled. Memristive device 200 is analogous to memristive device(s) 100 and/or 100'. Thus, memristive device 200 includes memristive interlayer connectors 240 and layers 211, 221, 231 that are analogous to memristive interlayer connectors 140 and layers 111, 121 and/or 131, respectively. Memristive interlayer connectors 240 thus include a conductive portion 242 and a memristive portion 244 analogous to conductive portion 142 and memristive portion 144, respectively. Layer 211 includes conductive lines 210 that are analogous to conductive lines 110. Layer 221 includes conductive lines 220 that are analogous to conductive lines 120. Layer 231 includes conductive lines 230 that are analogous to conductive lines 130. Memristive device 200 also includes an additional layer 251 including conductive lines 250 that is analogous to layers 211, 221 and/or 231 and conductive lines 210, 220, and/or 230. Thus, conductive lines 210, 220, 230 and 250 are lithographically defined.

Conductive lines 210, 220, 230 and 250 have a more arbitrary shape (e.g. are not straight lines) than conductive lines 110, 120 and 130. However, conductive lines 210, 220, 230 and 250 may be still be fabricated via photolithography. For example, straight conductive line segments within a layer extending in different directions may intersect. At the intersections, the conductive lines 210, 220, 230 and 250 have corners, nodes, curves and/or other non-linear sections. Such conductive line segments are electrically connected and have a more arbitrary shape. Such non-linear, arbitrarily-shaped conductive lines 210, 220, 230 and 250 may be more easily have irregular, non-ordered (e.g. random) and/or sparse connectivity to memristive interlayer connectors 240. Thus, conductive lines 210, 220, 230 and 250 may be densely or sparsely connected. However, fabrication of each layer 210, 220, 230, and/or 250 may still be deterministic and repeatable. In addition, although all layers 210, 220, 230 and 250 are shown as having arbitrarily-shaped conductive lines 210, 220, 230 and 250, in some embodiments, one or more layers may have straight conductive lines.

Figure 3:
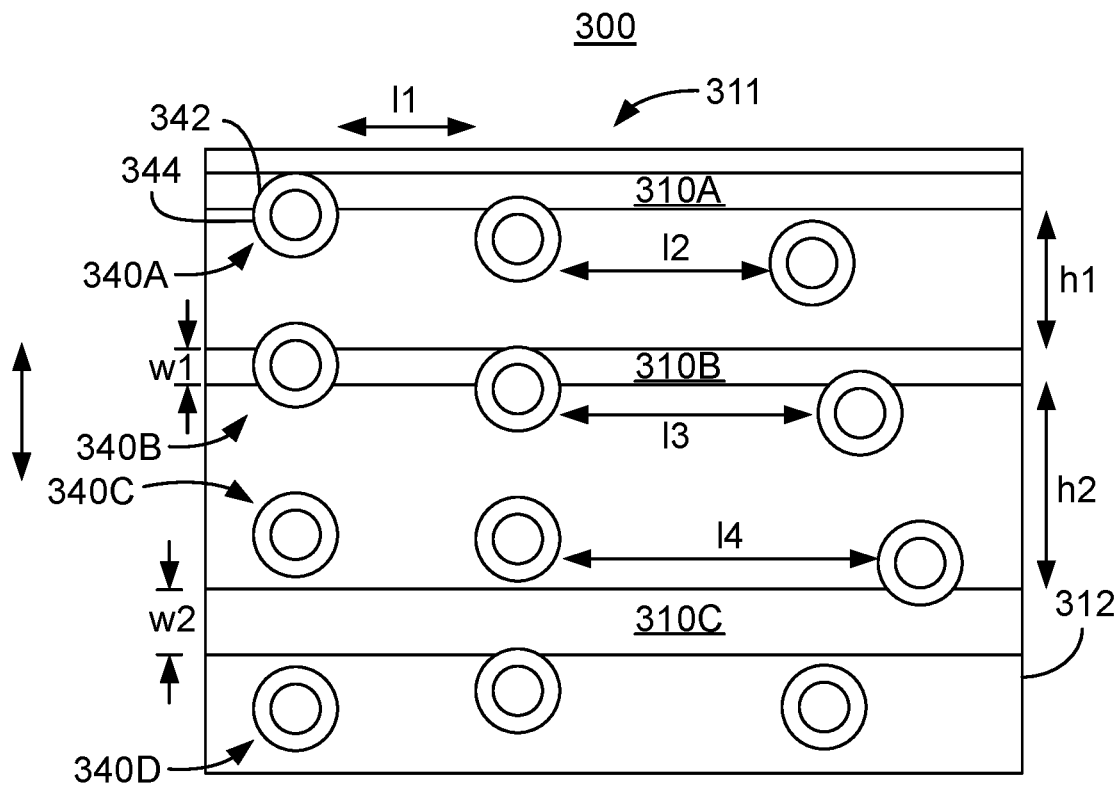
FIG. 3 depicts an embodiment of a portion of a memristive device.

FIG. 3 depicts a top view of layer 311 in an embodiment of memristive device 300. For clarity, only a portion of memristive device 300 is shown and FIG. 3 is not to scale. For simplicity, only some structures are labeled. Memristive device 300 is analogous to memristive device(s) 100, 100' and/or 200. Thus, memristive device 300 includes memristive interlayer connectors such as labeled memristive connectors 340A, 340B, 340C and 340D (collectively or generically memristive connectors 340) and conductive lines 310A, 310B and 310C (collectively or generically conductive lines 310) that are analogous to memristive interlayer connectors 140 and conductive lines 110 and/or 210.

In layer 311 of the width of conductive lines 310 as well as the distance between conductive lines 310 (i.e. the pitch) varies. Thus, conductive lines 310A and 310B are separated by distance h1, while conductive lines 310B and 310C are separated by a different distance h2. In addition, conductive line 310B has width w1, while conductive line 310C has a different width w2. The geometry of memristive interlayer connectors 340 also varies. Thus, various distances l1, l2, l3 and l4 separate memristive interlayer connectors 340. In some embodiments, distances in other directions may be varied. Layer 311 is also sparsely connected. In other embodiments, layer 311 might be densely connected. Although distances are varied, memristive device 300 is still lithographically formed and thus deterministic and repeatable in its fabrication. However, variations in layer 311, as well as other layers (not shown) may allow for greater irregularity in memristive device 300.

Figure 4:
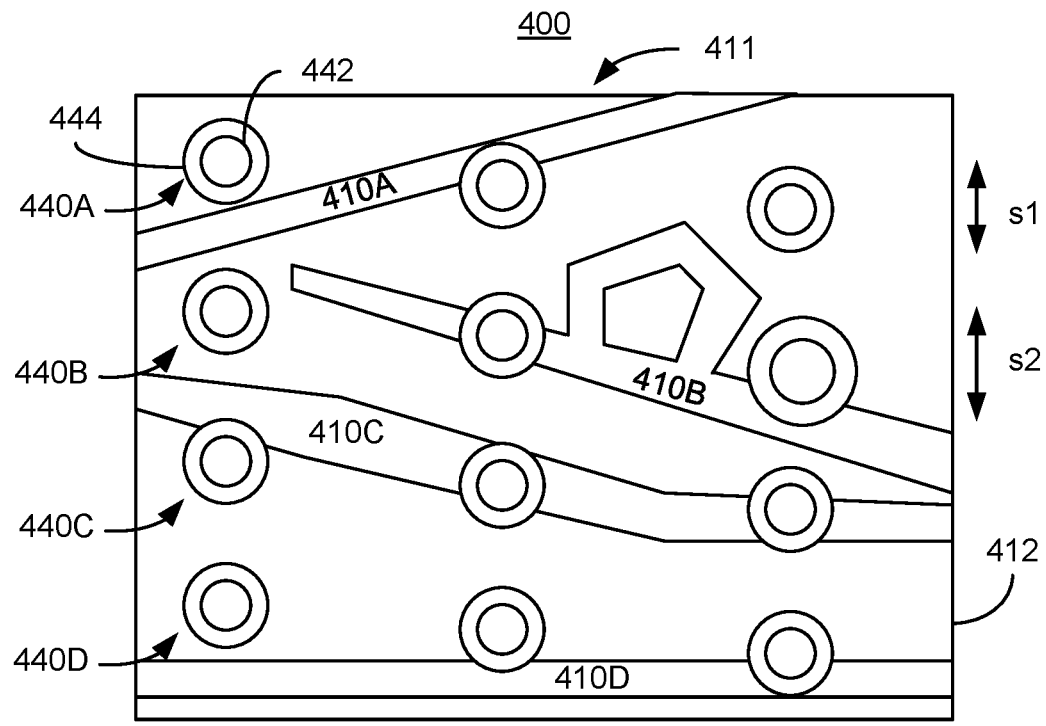
FIG. 4 depicts an embodiment of a portion of a memristive device.

FIG. 4 depicts a top view of layer 411 in an embodiment of memristive device 400. For clarity, only a portion of memristive device 400 is shown and FIG. 4 is not to scale. For simplicity, only some structures are labeled. Memrisdevice 400 is analogous to memristive device(s) 100, 100', 200 and/or 300. Thus, memristive device 400 includes memristive interlayer connectors such as labeled memristive connectors 440A, 440B, 440C and 440D (collectively or generically memristive connectors 440) and conductive lines 410A, 410B, 410C and 410D (collectively or generically conductive lines 410) that are analogous to memristive interlayer connectors 140 and conductive lines 110 and/or 210.

In layer 411 of the width of conductive lines 410 as well as the distance between conductive lines 410 varies. Further, conductive lines 410 are not parallel and extend different distances. For example, conductive line 410B terminates in the field of view shown. Further, conductive line 410B is shown as including a loop. Conductive line 410C not only has multiple line segments meeting at corners and extending in different directions, but also has a varying width. The geometry of memristive interlayer connectors 440 also varies. Memristive interlayer connectors 440 also have different diameters s1 and s2. Layer 411 is also sparsely connected. In other embodiments, layer 411 might be densely connected. Although the geometry is varied, memristive device 400 is still lithographically provided and thus deterministic and repeatable in its fabrication. Variations in layer 411, as well as other layers (not shown) may allow for greater irregularity in memristive device 400.

Figure 5:
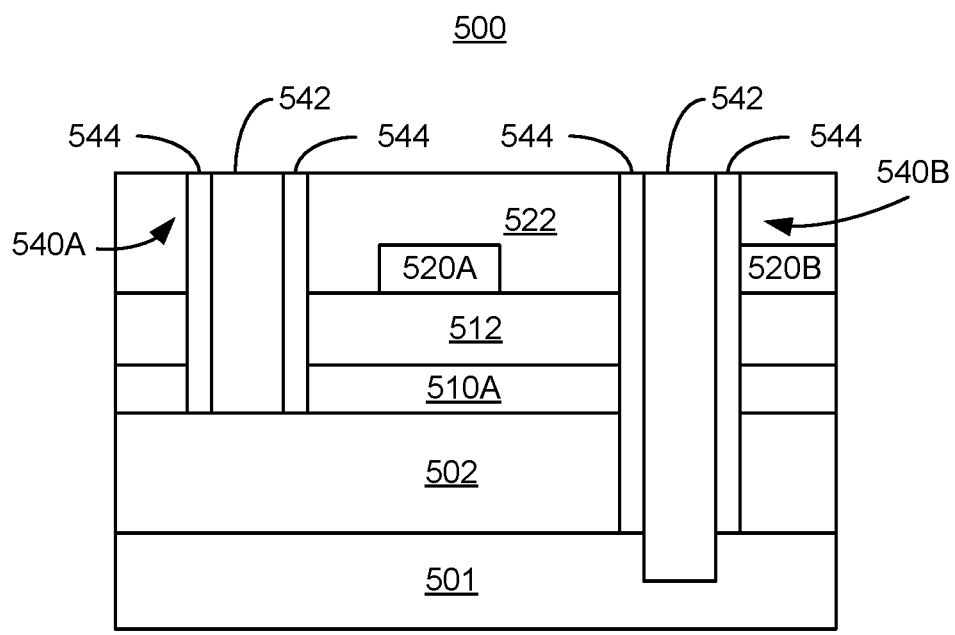
FIG. 5 depicts an embodiment of a portion of a memristive device.

FIG. 5 depicts a cross-sectional view of an embodiment of memristive device 500. For clarity, only a portion of memristive device 500 is shown and FIG. 5 is not to scale. For simplicity, only some structures are labeled. Memristive device 500 is analogous to memristive device(s) 100, 100', 200, 300 and/or 400. Thus, memristive device 500 includes memristive interlayer connectors 540A and 540B (collectively or generically memristive interlayer connector(s) 540) and conductive lines 510A and 520A that are analogous to memristive interlayer connectors 140 and conductive lines 110 and/or 120. Also shown are insulators 502, 512 and 522 analogous to insulators 102, 112, and 122, respectively.

Memristive interlayer connectors 540A and 540B have different depths. Thus, memristive interlayer connector 540A extends through conductive line 510A. However, memristive interlayer connector 540B extends into substrate 501. Thus, connectivity may also be controlled using the depth (e.g. number of layers) through which memristive interlayer connectors 110 penetrate. Moreover, memristive interconnects may also be extended to multiple devices. For example, memristive interconnect 540A and/or 540B might be connected to another device via a conductive (e.g. metal/solder) bump fabricated on the top surface of memristive device 500. Another memristive or other semiconductor device may be electrically connected to memristive interconnect(s) 540A and/or 540B at the conductive bump. Thus, not only may conductive lines in multiple layers be coupled through memristive interconnects, but multiple devices may also be coupled via memristive interconnects.

Memristive device(s) 200, 300, 400 and/or 500 are analogous to memristive devices 100 and/or 100'. Consequently, memristive device 200, 300, 400 and/or 500 may share the benefits of memristive devices 100 and/or 100'. Memristive device(s) 200, 300, 400 and/or 500 may provide networks that are complex, randomized, irregular and/or sparsely connected, but formed lithographically and deterministically. Consequently, benefits of sparse networks, such as improved modeling of biologic systems in neural networks, improved performance, and/or improved scaling, may be attained. Further, the fabrication of each layer in each device, as well as device 200, 300, 400 and/or 500 as a whole, is simplified and repeatable. As a result, performance of systems using memristive device 200, 300, 400 and/or 500 may be improved.

Figure 6:
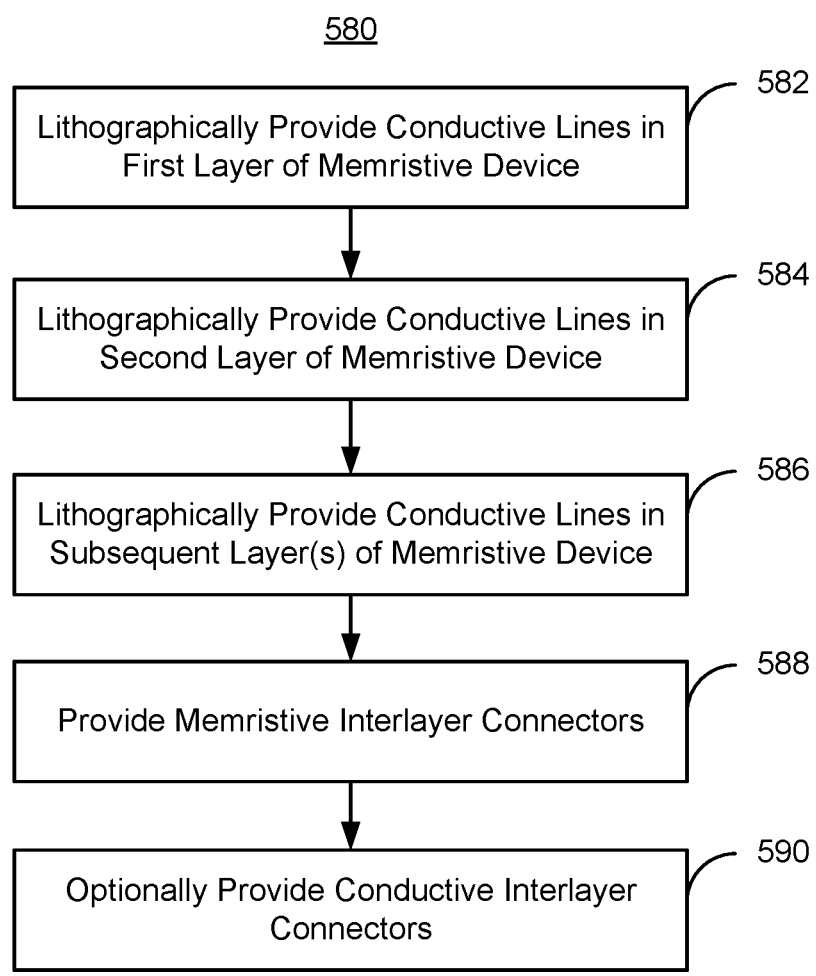
FIG. 6 is a flow-chart depicting an embodiment of a method for providing a memristive device.

FIG. 6 is a flow-chart depicting an embodiment of method 580 for providing a memristive device. For clarity, only some steps are shown. Other and/or additional procedures may be carried out in some embodiments. Although described in the context of a flow, processes in method 580 may be carried out in parallel and/or may be interleaved.

A first set of conductive lines in a first layer of the memristive devices is lithographically defined, at 582. Stated differently, lithography (e.g. photolithography, UV lithography and/or DUV lithography) is used in fabricating the first set conductive lines. Although termed a first layer of the memristive devices, the layer fabricated at 582 may be formed on underlying structures. For example, a substrate, neurons, insulating layers, conductive lines, other semiconductor devices, electrodes, and/or other structures may have already been formed. Further, other structures may be formed in this layer of the memristive devices. The first set of conductive lines may be formed using a damascene process (lines formed in trenches provided in an insulating layer, a process in which a conductive (e.g. metal) layer is deposit and patterned, and/or through other technique(s).

A second set of conductive lines is lithographically defined for a second layer of the memristive devices, at 584. Some or all of the second set of conductive lines are insulated from the first set conductive lines. Thus, as part of 582 or 584, an insulating layer may be deposited on the first set of conductive lines. As part of 584, the second set of conductive lines may also be insulated. In some embodiments, 584 is performed in a manner analogous to 582. Subsequent layer(s) of conductive lines are optionally fabricated at 586. In some embodiments, 586 is performed in an analogous manner to 582 and/or 584. Thus, multiple layers of conductive lines may be formed.

Memristive interlayer connectors are lithographically provided, at 588. The memristive interlayer connectors are coupled with a first portion of the first set conductive lines in the first layer and coupled with a second portion of the second set of conductive lines in the second layer. The memristive interlayer connectors may be sparsely coupled with the first plurality of conductive lines and sparsely coupled with the second plurality of conductive lines. The memristive interlayer connectors are also coupled with portions of the conductive lines in subsequent layers. For example, 588 may include providing a mask having apertures in the locations of the memristive interlayer connectors and removing (e.g. etching) the exposed portions of the memristive device. Thus, vias are formed. A memristive material may then be deposited to cover the sides of the vias. The vias are then filled with a conductive (e.g. metal) material. In other embodiments, the memristive interlayer connectors may be formed in another manner. For example, a memristive layer may be deposited and optionally patterned prior to formation of the vias described above. The vias may be filled with a conductive material such that the memristive layer is interposed between the conductive portion of the memristive interlayer connectors and the conductive lines. In some embodiments, portions of 588 may be interleaved with 582, 584, and/or 586. For example, conductive vias may be formed after a subset of the layers has been fabricated.

In some embodiments, additional conductive interlayer connectors are fabricated, at 590. These conductive interlayer connectors may be lithographically formed. For example, 590 may include providing a mask having apertures in the locations of the conductive interlayer connectors and removing (e.g. etching) the exposed portions of the memristive device. Thus, vias are formed. The vias are then filled with a conductive (e.g. metal) material to provide the conductive interlayer connectors. Thus, a memristive device may be formed.

Figure 7A:
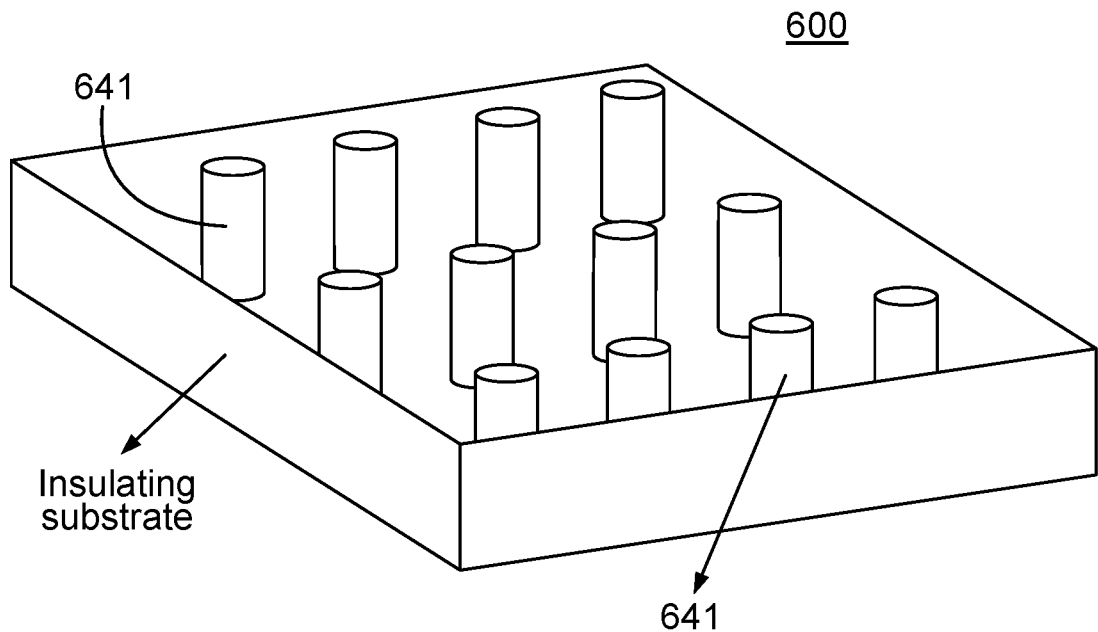
FIGS. 7A-7G depict an embodiment of a memristive device during formation.
Figure 7B:
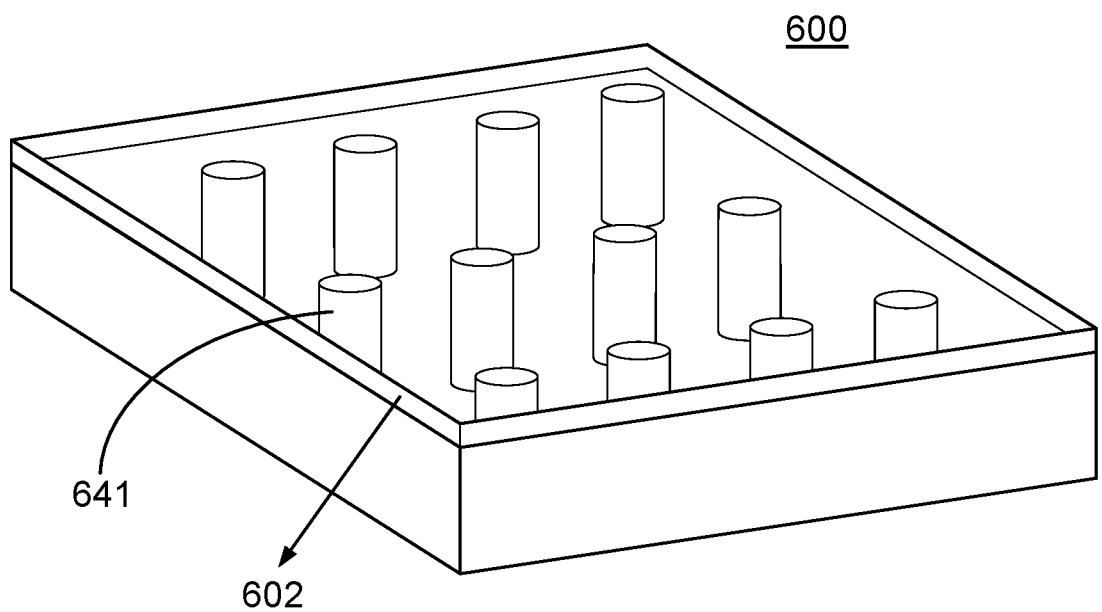

For example, FIGS. 7A-7G depict an embodiment memristive device 600 during formation using method 580. For clarity, only a portion of memristive device 600 is shown and FIGS. 7A-7G are not to scale. For simplicity, only some structures are labeled. FIG. 7A-7B depict memristive device 600 prior to method 580 commencing. Thus, an underlying insulating substrate and embedded pads 641 are shown. Pads 641 may be metal pads formed on the insulating substrate (e.g. metal 0). Pads 641 may be considered part of memristive interlayer connectors being formed, or may be considered separate components to which memristive interlayer connectors may be electrically connected. In some embodiments, other devices (not shown) have also been formed. For example, neurons or other devices may have been provided on or in the insulating substrate. FIG. 7B depicts memristive device 600 after an insulating layer 602 (e.g. insulator 1) has been formed on embedded pads 641.

Figure 7C:
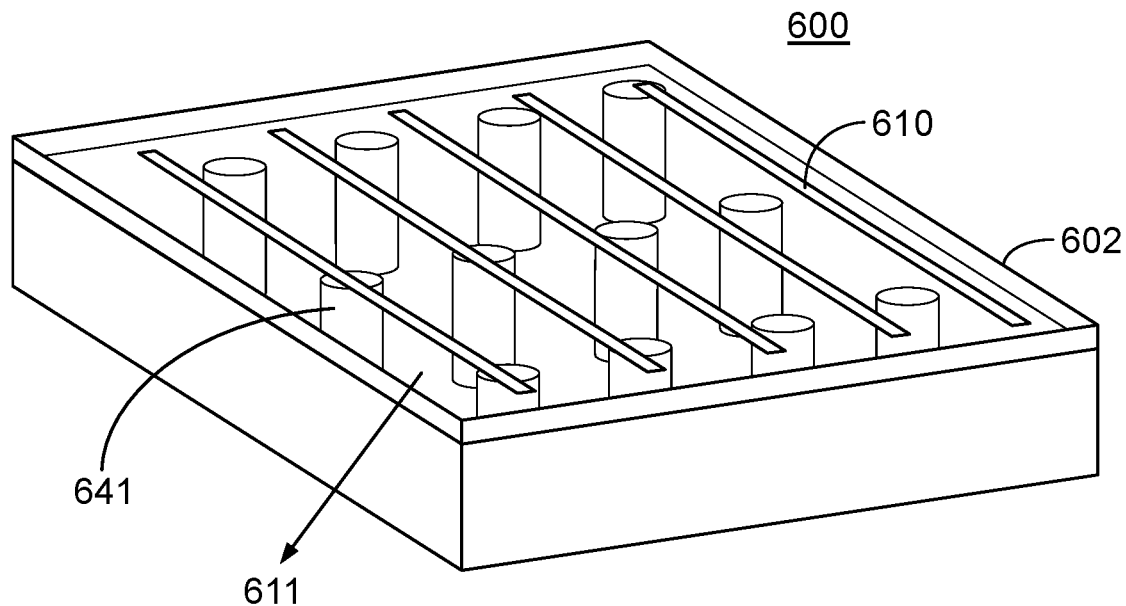

FIG. 7C depicts conductive lines (e.g. metal 1) 610 for first layer 611 formed on insulating layer 102 in 582 of method 580. In some embodiments, conductive lines 610 are formed on insulating layer 102. In such embodiments, conductive lines 610 are insulated by a next layer of insulating dielectric (not shown in FIG. 7C). In some embodiments, a damascene process may be used in 582 (e.g. formation of trenches in the insulating layer, followed by formation of metal lines in the trenches). However, other techniques may be used. In some embodiments, conductive lines 610 are electrically connected to the underlying embedded pads 641. Conductive lines 610, layer 611, and insulator 602 are analogous to conductive lines 110, layer 111 and insulator 102 or 112.

Figure 7D:
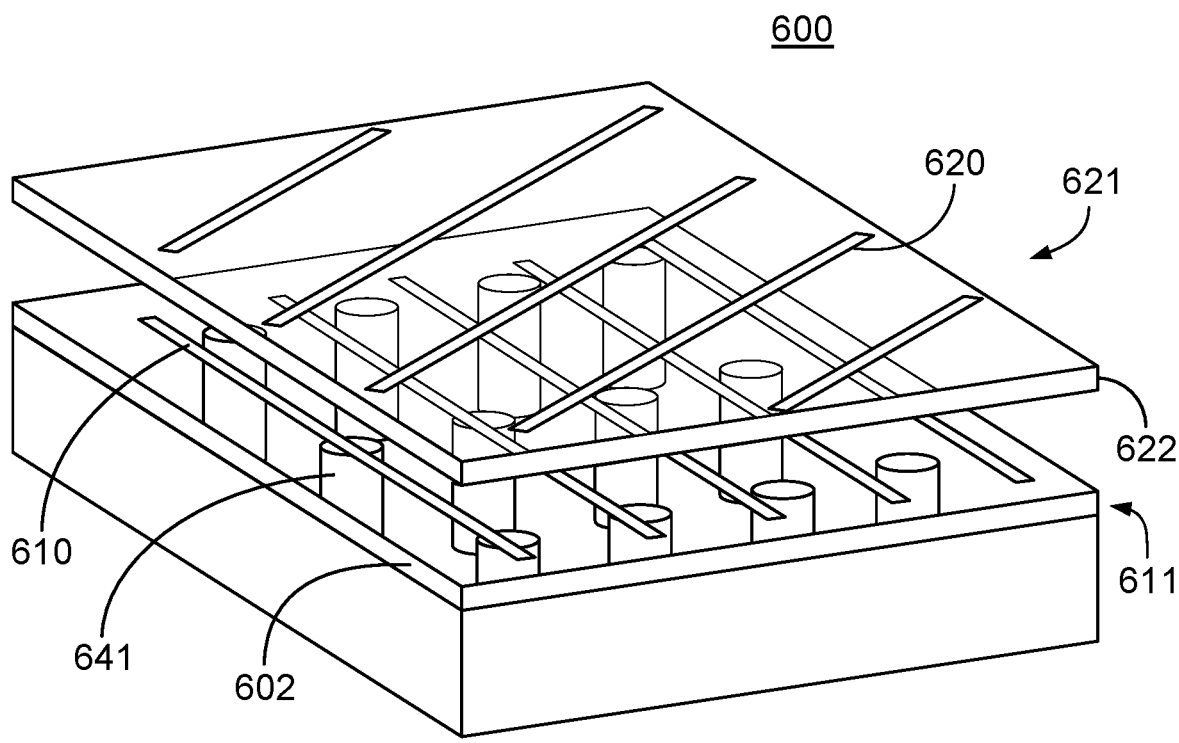

FIG. 7D depicts memristive device 600 after formation of the second set of conductive lines in the second layer, at 584. Further, 584 may be performed in a manner analogous to 582. Thus, conductive lines 620 in second layer 621 have been formed in insulating layer 622. Insulating layer 622 may be the second insulating layer (insulator 2). Second set of conductive lines 620 may be the second metal layer (metal 2). The conductive lines 620 are formed at a nonzero acute angle from conductive lines 610. Thus, conductive lines 620, layer 621 and insulator 622 are analogous to conductive lines 120, layer 121 and insulator 122.

Figure 7E:
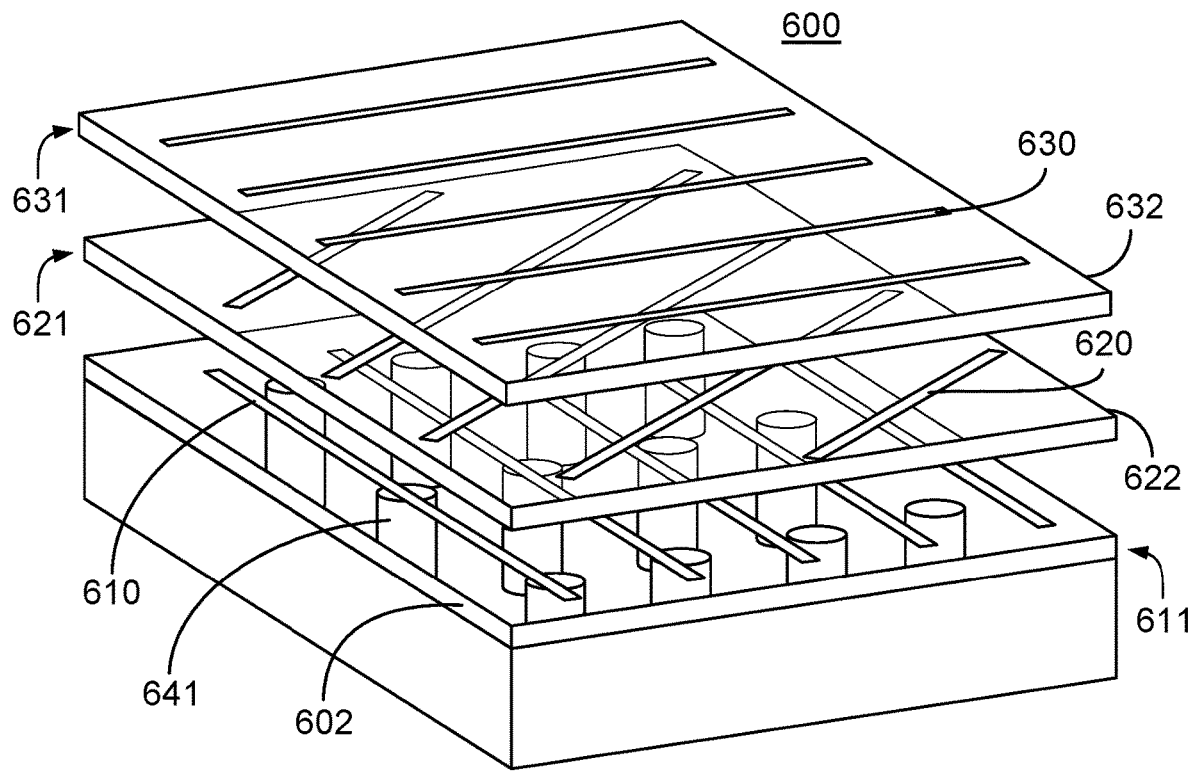

FIG. 7E depicts memristive device 600 after 586 is performed. Thus, memristive device 600 includes third layer 631 including third insulating layer 632 (e.g. insulator 3) and a third set of conductive lines 630 (e.g. metal 3). In the embodiment shown, conductive lines 630 are perpendicular to conductive lines 610. However, other angles are possible. Conductive lines 630, layer 631 and insulator 632 are analogous to conductive lines 130, layer 131 and insulator 132.

Figure 7F:
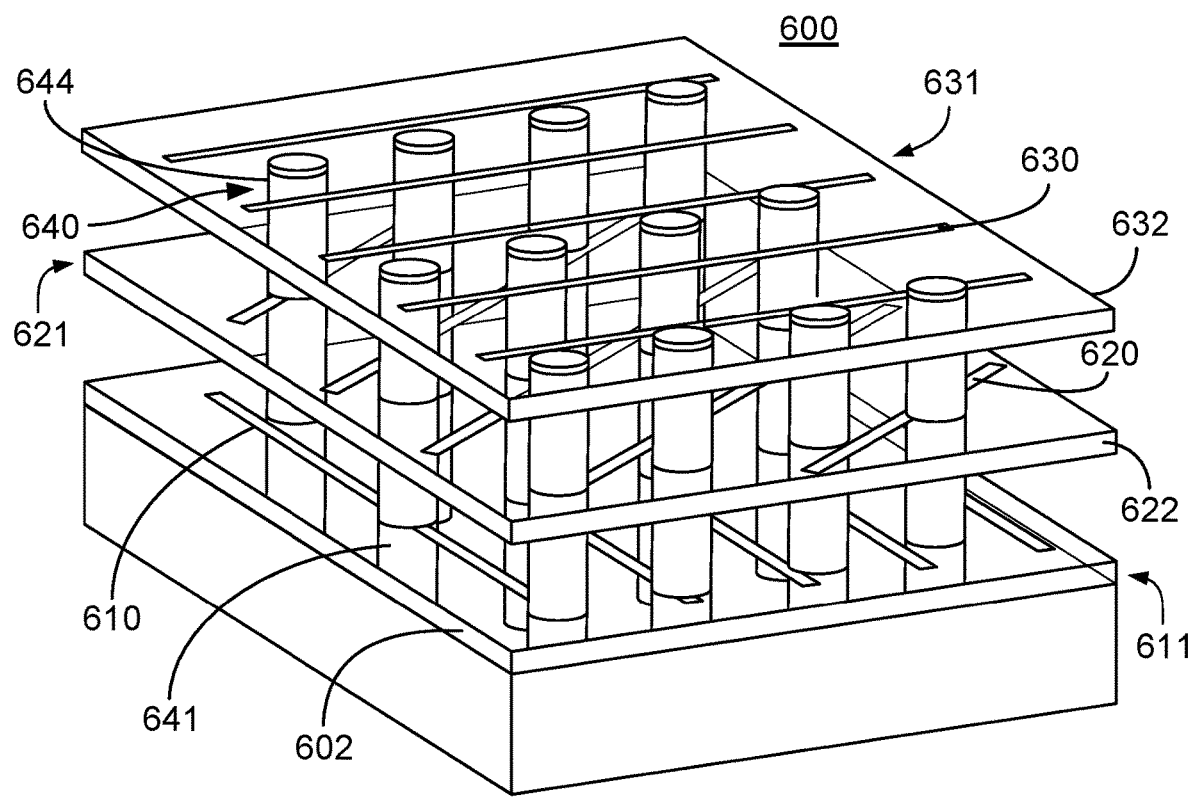

FIG. 7F depicts memristive device 600 formation of memristive portion of memristive interlayer connectors 640 in part of 588. In some embodiments, memristive interlayer connectors 640 are formed by providing a via at least to conductive lines 120 in layer 111 (e.g. metal 1) and, in some embodiments, to the underlying embedded pads 641 (e.g. metal 0). A memristive material is deposited. The memristive material 642 covers at least a portion (or all) of the sidewalls of the vias. However, as depicted in FIG. 7F, a central portion of the each via may remain empty. In other embodiments, a portion of the memristive material may be removed.

Figure 7G:
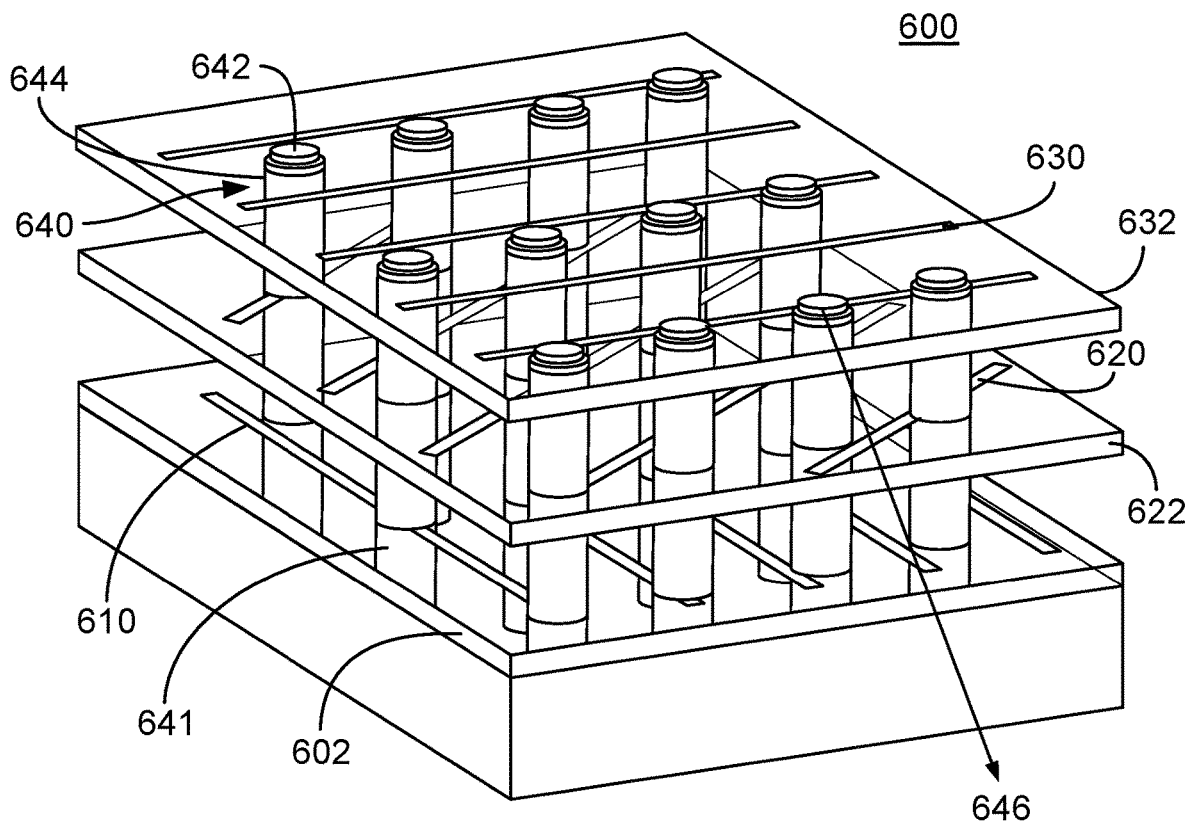

FIG. 7G depicts memristive device 600 after formation of the conductive portion 642 (e.g. metal pillars) of memristive interlayer connectors 640 in part of 588. Thus, conductive pillar 642 (e.g. a core) has been provided in each of the vias and memristive interlayer connectors 640 have been formed. FIGS. 7F-7G indicate that the vias are formed through multiple layers of metal, the memristive material for multiple metal layers deposited and the conductive pillar for multiple metal layers are formed in that order. In other embodiments, vias may be formed through single metal layer, the memristive material and conductive pillar (e.g. metal) for that metal layer formed before a subsequent metal layer is formed. Such portions of memristive interlayer connectors may be aligned and stacked to form the memristive interlayer connectors shown. In some embodiments, memristive interlayer connectors may be formed through only some metal layers (e.g. between metal 1 and metal 2 but not between metal 2 and metal 3; or between metal 2 and metal 3 only).

Thus, memristive device(s) such as memristive device 600 may be lithographically fabricated. Consequently, memristive device 600 may share the benefits of memristive devices 100, 100', 200, 300, 400 and/or 500. Memristive device 600 may provide networks that are complex, randomized, irregular and/or sparsely connected, but formed lithographically and deterministically. Consequently, benefits of sparse networks, such as improved modeling of biologic systems in neural networks, improved performance, and/or improved scaling, may be attained. Further, the fabrication of each layer in each device, as well as device 600 itself, is simplified and repeatable. As a result, performance of systems using memristive device 600 may be improved.

Figure 8:
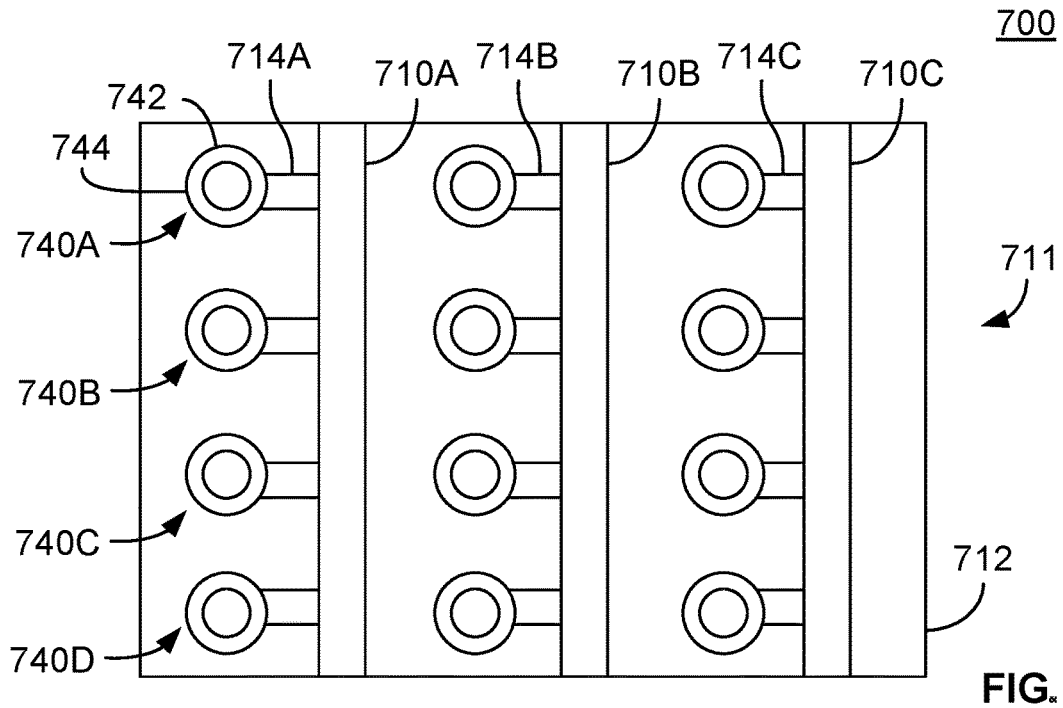
FIG. 8 depicts an embodiment of a portion of a memristive device.

FIG. 8 depicts a plan view of a portion of an embodiment of memristive device 700. For clarity, only a portion of memristive device 700 is shown and FIG. 8 is not to scale. For simplicity, only some structures are labeled. Memristive device 700 is analogous to memristive device(s) 100, 100', 200, 300, 400, 500 and/or 600. Thus, memristive device 700 includes memristive layer 711, memristive interlayer connectors 740A, 740B, 740C, and 740D (generically or collectively memristive interlayer connector(s) 740) and conductive lines 710A, 710B, and 710C (generically or collectively conductive lines 710). Layer 711, memristive interlayer connectors 740, and conductive lines 710 are analogous to layer 111, 121, and/or 131, memristive interlayer connectors 140, and conductive lines 110, 120 and/or 130, respectively.

Memristive device 700 also includes conductive branch structures (of which only some are labeled) 714A, 714B, and 714C (collectively or generically conductive branch structures 714). In some embodiments, conductive branch structure 714 is a short metal line segment. Conductive branch structures 714 extend between corresponding memristive interlayer connectors 740 and the conductive line 710. Although all memristive interlayer connectors 740 in a column are shown as being memristively connected to a nearby conductive line 710 through conductive branch structures 714, in some embodiments fewer (including zero) memristive interlayer connectors 740 in a column are coupled to the nearby conductive line 710. For example, some of conductive branch structures 714 in a particular layer may be omitted. The conductive branch structures that are omitted (if any) may vary between layers. Conductive branch structures 714 may be lithographically fabricated in a manner analogous to conductive lines 710.

Memristive device 700 may share the benefits of memristive devices 100, 100', 200, 300, 400, 500 and/or 600. Memristive device 700 may provide networks that are complex, randomized, irregular and/or sparsely connected, but formed lithographically and deterministically. Consequently, benefits of sparse networks, such as improved modeling of biologic systems in neural networks, improved performance, and/or improved scaling, may be attained. Further, the fabrication of each layer in each device, as well as device 700, is simplified and repeatable. As a result, performance of systems using memristive device 700 may be improved.

Figure 9A:
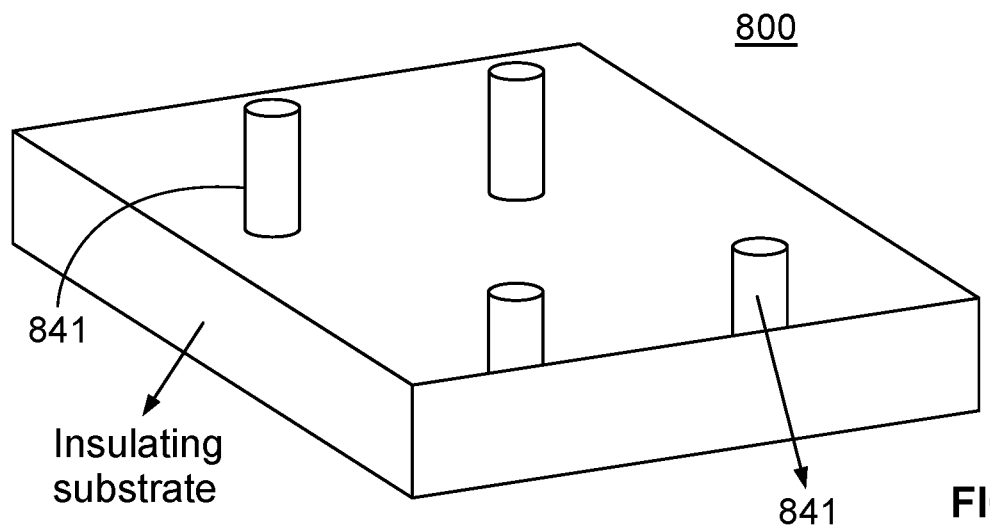
FIGS. 9A-9G depict an embodiment of a portion of a memristive device during fabrication.
Figure 9B:
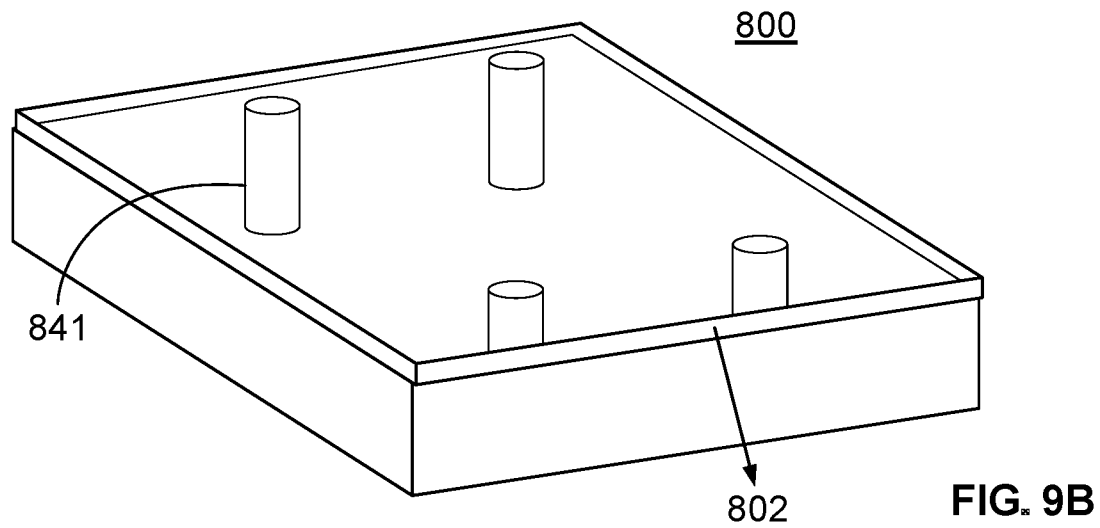

FIGS. 9A-9G depict an embodiment of a portion of memristive device 800 during formation. For clarity, only a portion of memristive device 800 is shown and FIGS. 9A-9G are not to scale. For simplicity, only some structures are labeled. Memristive device 800 is analogous to memristive device 700. Memristive device 800 may be formed using method 580 and is described in the context of method 580. However, other techniques may be used in forming memristive device 800. FIG. 9A-9B depict memristive device 800 prior to method 580 commencing. Thus, an underlying insulating substrate and embedded pads 841 are shown. Pads 841 may be metal pads formed on the insulating substrate (e.g. metal 0). Pads 841 may be considered part of memristive interlayer connectors being formed, or may be considered separate components to which memristive interlayer connectors may be electrically connected. In some embodiments, other devices (not shown) have also been formed. For example, neurons or other devices may have been provided on or in the insulating substrate. FIG. 8B depicts memristive device 800 after an insulating layer 802 (e.g. insulator 1) has been formed on embedded pads 841.

Figure 9C:
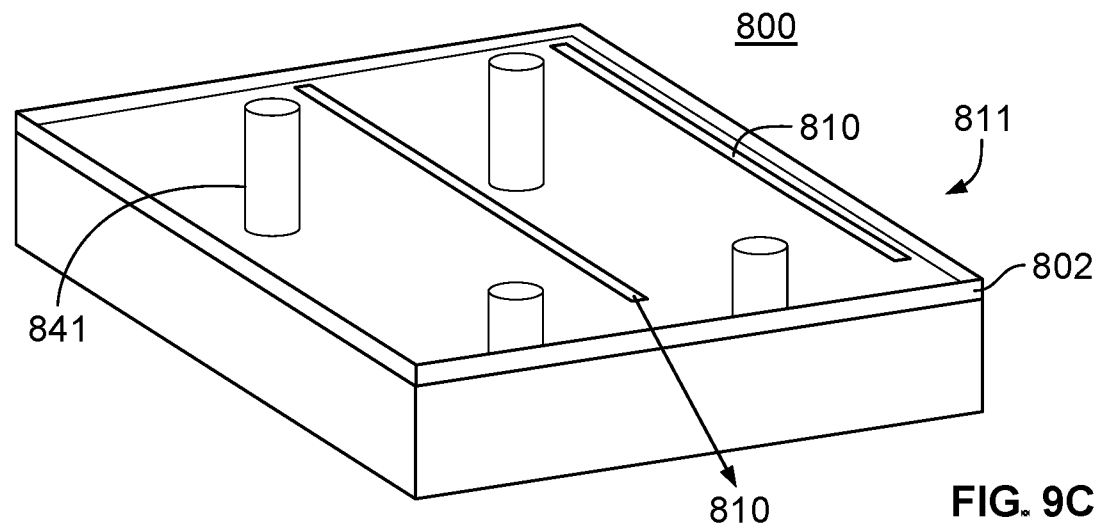

FIG. 9C depicts conductive lines (e.g. metal 1) 810 for first layer 811 formed on insulating layer 102 in 582 of method 580. In some embodiments, conductive lines 810 are formed on insulating layer 802. In such embodiments, conductive lines 810 are insulated by a next layer of insulating dielectric (not shown in FIG. 9C). In some embodiments, a damascene process may be used in 582 (e.g. formation of trenches in insulating layer 802, followed by formation of metal lines in the trenches). However, other techniques may be used. In some embodiments, conductive lines 810 are electrically connected to the underlying embedded pads 841. Conductive lines 810, layer 811, and insulator 802 are analogous to conductive lines 110, layer 111 and insulator 102 or 112.

Figure 9D:
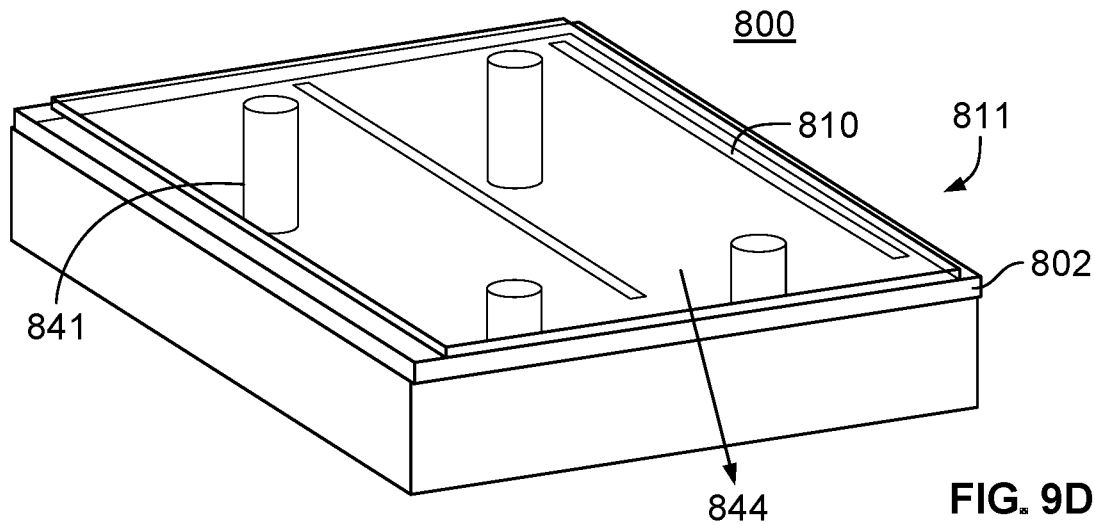

FIG. 9D depicts formation of a layer of memristive material 844 on conductive lines 810 as part of 588 of method 580. Memristive material 844 may thus be used in the memristive interlayer connectors. In the embodiment shown, a sheet of memristive material 844 has been deposited. In some embodiments, memristive material 844 is patterned such that memristive tabs are only in the region near conductive lines 810 and the conductive branch structures (not shown in FIG. 9D) to be formed.

Figure 9E:
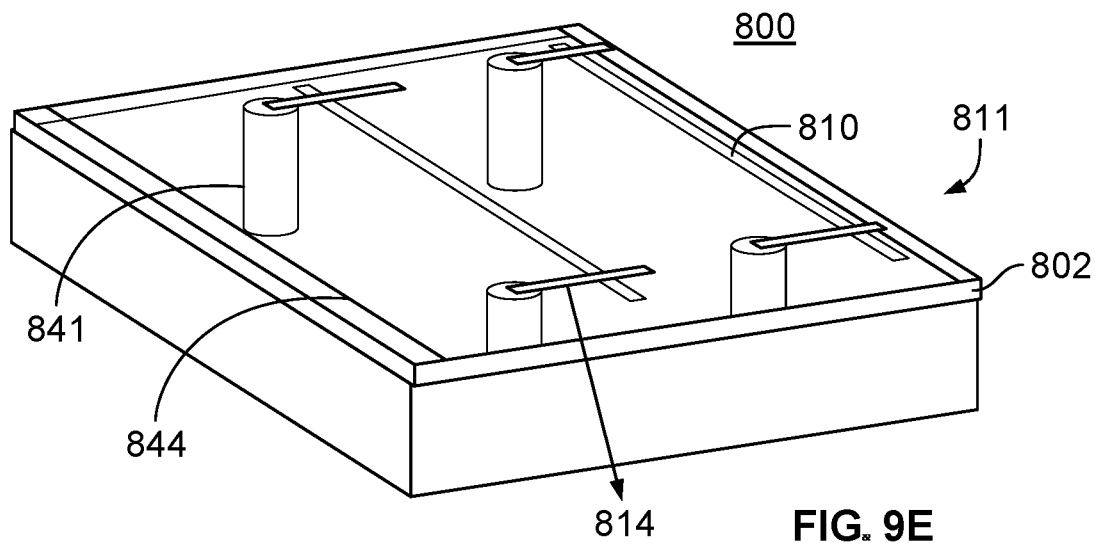

FIG. 9E depicts formation of the conductive branch structure 814 for conductive lines 810. Branch structure 814 is analogous to branch structure 714. In the embodiment shown, however, branch structure 814 is separated from the corresponding main conductive line 810 by a memristive layer. However, the branch structure may still be considered part of conductive line 810 (and thus the first metal layer). Thus, a portion of 582 may be considered to have been carried out for conductive branch structure 814.

Figure 9F:
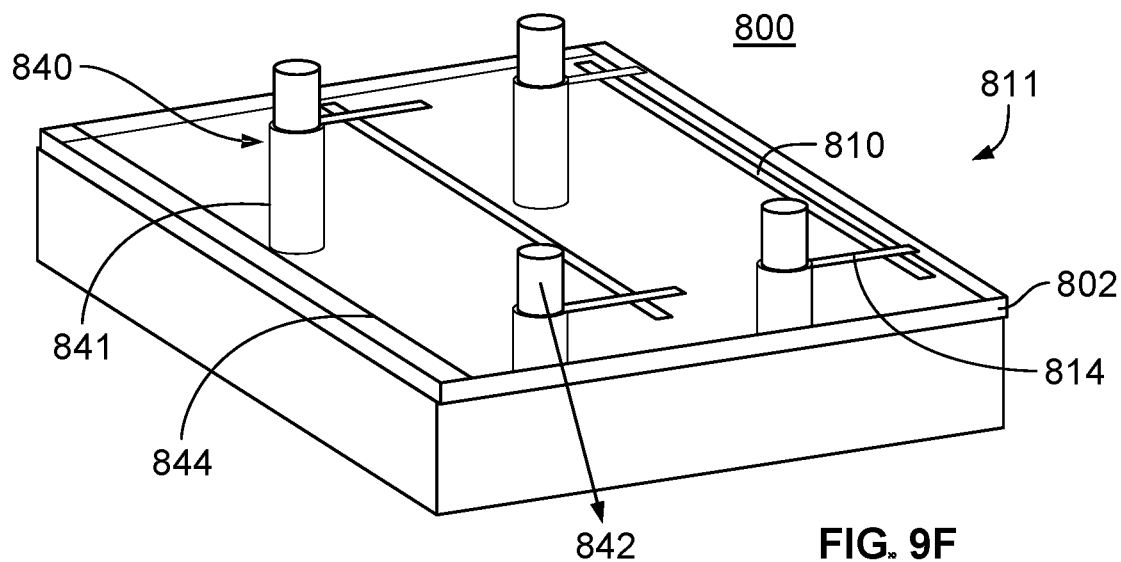

FIG. 9F depicts memristive device 800 after formation of a conductive (e.g. metal) connection 842 as part of 588 of method 580. In some embodiments, conductor 842 makes electrical connection to the underlying metal pads. Thus, a via may be formed through layer 811 (metal 1) and insulating layer 802 (insulating layer 1) to embedded pads 841 (metal 0). The via is filled with conductive material 842 (e.g. metal). Thus, memristive interlayer connectors 840 including a portion of memristive material 844 and conductor 842 are formed. In alternate embodiments, the via may include a memristive shell/layer analogous to those depicted in FIG. 1. However, in the embodiment shown, such an additional memristive material is not used.

Figure 9G:
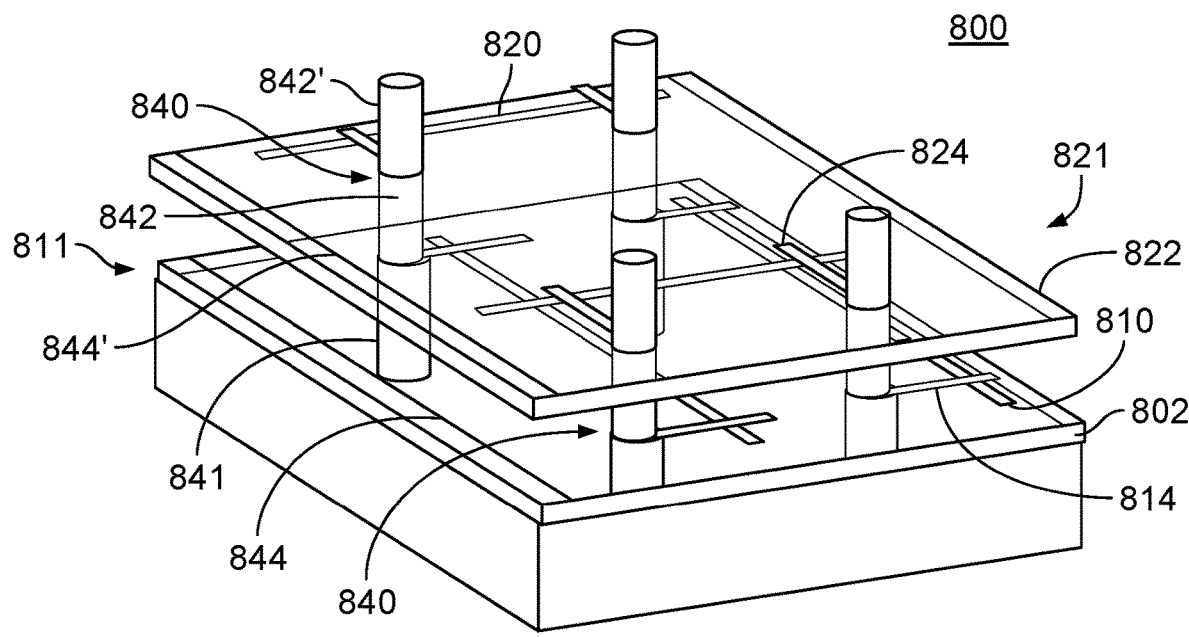

This process is repeated for subsequent metal layers in 584, 586, and 588. Memristive device 800 including a second layer 821 formed at 584 is shown in FIG. 9G. In the embodiment shown, metal lines 820 are formed in insulating layer 822 at 84. Another memristive layer 844' and another conductive portion 842' have been formed. A memristive interlayer connector includes memristive portions 844 and 844' as well as conductive portions 842 and 842'. Thus, formation of memristive interlayer connectors 840 has continued at 588 of method 580. Thus, memristive interconnects 840 are still memristively coupled with conductive lines 810 and 820. However, memristive interconnects 840 are configured with memristive layers 844 and 844' instead of a memristive shell. In the embodiment shown, conductive lines 820 are perpendicular to conductive lines 810. However, the conductive lines in subsequent layers may extend in different directions. In some embodiments, layer(s) 811 and/or 821 may include conductive lines having arbitrary shapes. In some embodiments, each layer has a different (e.g. unique) wiring pattern.

Memristive device 800 may share the benefits of memristive devices 100, 100', 200, 300, 400, 500, 600, and/or 700. Memristive device 800 may provide networks that are complex, randomized, irregular and/or sparsely connected, but formed lithographically and deterministically. Consequently, benefits of sparse networks, such as improved modeling of biologic systems in neural networks, improved performance, and/or improved scaling, may be attained. Further, the fabrication of each layer in each device, as well as device 800, is simplified and repeatable. As a result, performance of systems using memristive device 800 may be improved.

Figure 10:
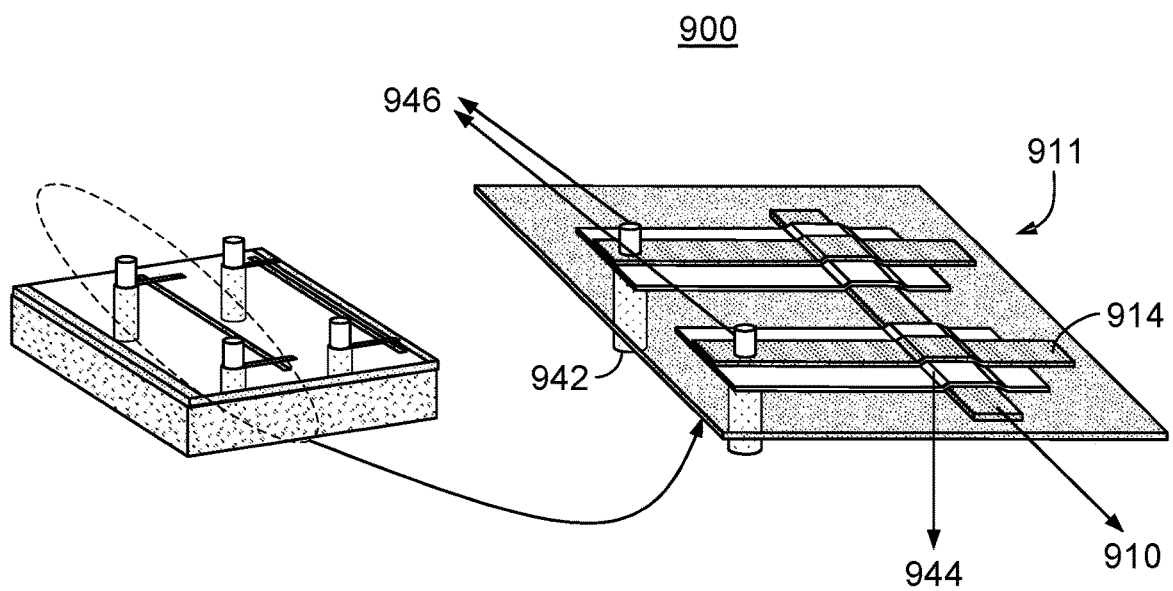
FIG. 10 depicts an embodiment of a portion of a memristive device.

FIG. 10 depicts a perspective view of a portion of an embodiment of memristive device 900. For clarity, only a portion of memristive device 900 is shown and FIG. 10 is not to scale. For simplicity, only some structures are labeled. Memristive device 900 is analogous to memristive device(s) 100, 100', 200, 300, 400, 500, 600, 700 and/or 800. For simplicity, only one layer 911 is shown. However, memristive device 900 may include multiple layers. Memristive device 900 includes layer 911, memristive interlayer connectors 940, and conductive lines 910 that are analogous to memristive interlayer connectors 140 and 840, and conductive lines 110 and 810, respectively.

Memristive device 900 also includes conductive branch structures 914 (of which only one is labeled). In some embodiments, conductive branch structure 914 is a short metal line segment. Conductive branch structures 914 extend between corresponding memristive interlayer connectors 940 and the conductive line 910. Conductive branch structures 914 may be lithographically fabricated in a manner analogous to conductive lines 910.

In the embodiment shown, memristive device 900 includes memristive layer tabs 944 sandwiched between conductive branch structures 914 and conductive lines 910. Thus, Memristive device 900 is analogous to memristive device 800 but in which memristive layer 844 has been patterned.

Memristive device 900 may share the benefits of memristive devices 100, 100', 200, 300, 400, 500, 600, 700 and/or 800. Memristive device 900 may provide networks that are complex, randomized, irregular and/or sparsely connected, but formed lithographically and deterministically. Consequently, benefits of sparse networks, such as improved modeling of biologic systems in neural networks, improved performance, and/or improved scaling, may be attained. Further, the fabrication of each layer in each device, as well as device 900, is simplified and repeatable. As a result, performance of systems using memristive device 900 may be improved.

Figure 11:
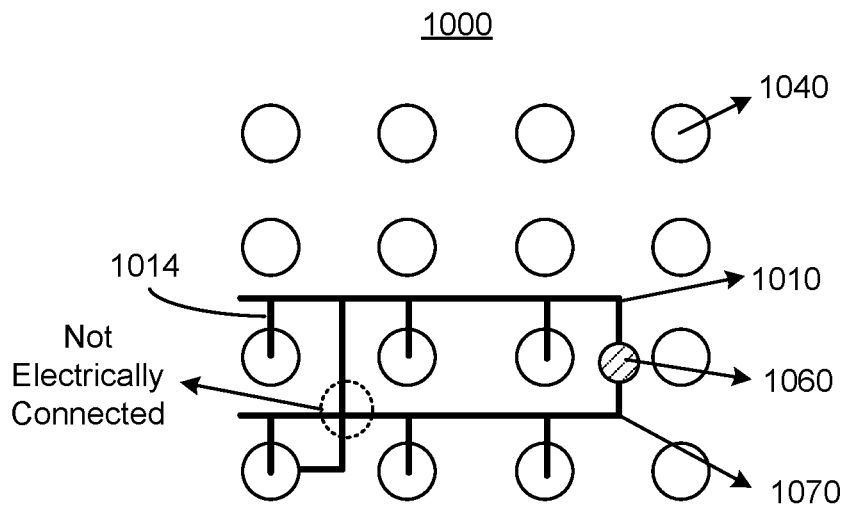
FIG. 11 depicts an embodiment of a portion of a memristive device.

FIG. 11 depicts a plan view of a portion of an embodiment of memristive device 1000. For clarity, only a portion of memristive device 1000 is shown and FIG. 11 is not to scale. For simplicity, only some structures are labeled. Memristive device 1000 is analogous to memristive device(s) 100, 100', 200, 300, 400, 500, 600, 700, 800 and/or 900. Only one layer is shown. However, memristive device 1000 may include multiple layers. Memristive device 1000 conductive lines 1010 (of which only one is labeled), conductive branch structures 1014 (of which only one is labeled), and memristive interlayer connectors 1040 (of which only one is labeled) that are analogous to conductive lines 110, 810 and/or 910, conductive branch structures 814 and/or 914, and memristive interlayer connectors 140, 840 and/or 940, respectively. Memristive materials may be incorporated as shells surrounding conductive pillars of memristive interlayer connectors 1040 or as tabs between conductive branch structures 1014 and conductive lines 1010.

Also shown is conductive interlayer connector 1060. Although only one conductive interlayer connector 100 is shown, more than one may be present in device. Conductive interlayer connectors 1060 may provide electrical connection to another layer, multiple other layers, and/or other devices (e.g. via a conductive bump analogous to that described in the context of FIG. 5). Alternatively, conductive interlayer connectors may simply be a metal pad. Conductive interlayer connector 1060 is coupled with conductive line 1070, which provides electrical connection to memristive interlayer connectors 1040. As indicated in FIG. 11, conductive lines 1010 and 1070 are not shorted despite crossing. Conductive interlayer connector 1060 may function as shorting via. For example, conductive interlayer connector 1060 may aid in fixing "broken" lines and/or extend the effective length of metal lines. Thus, a higher density connectivity may be achieved.

Thus, memristive device(s) such as memristive device 1000 may be lithographically fabricated. Consequently, memristive device 1000 may share the benefits of memristive devices 100, 100', 200, 300, 400, 500, 600, 700, 800 and/or 900. Memristive device 1000 may provide networks that are complex, randomized, irregular and/or sparsely connected, but formed lithographically and deterministically. Consequently, benefits of sparse networks, such as improved modeling of biologic systems in neural networks, improved performance, and/or improved scaling, may be attained. Further, the fabrication of each layer in each device, as well as device 1000 itself, is simplified and repeatable. As a result, performance of systems using memristive device 1000 may be improved.

Figure 12:
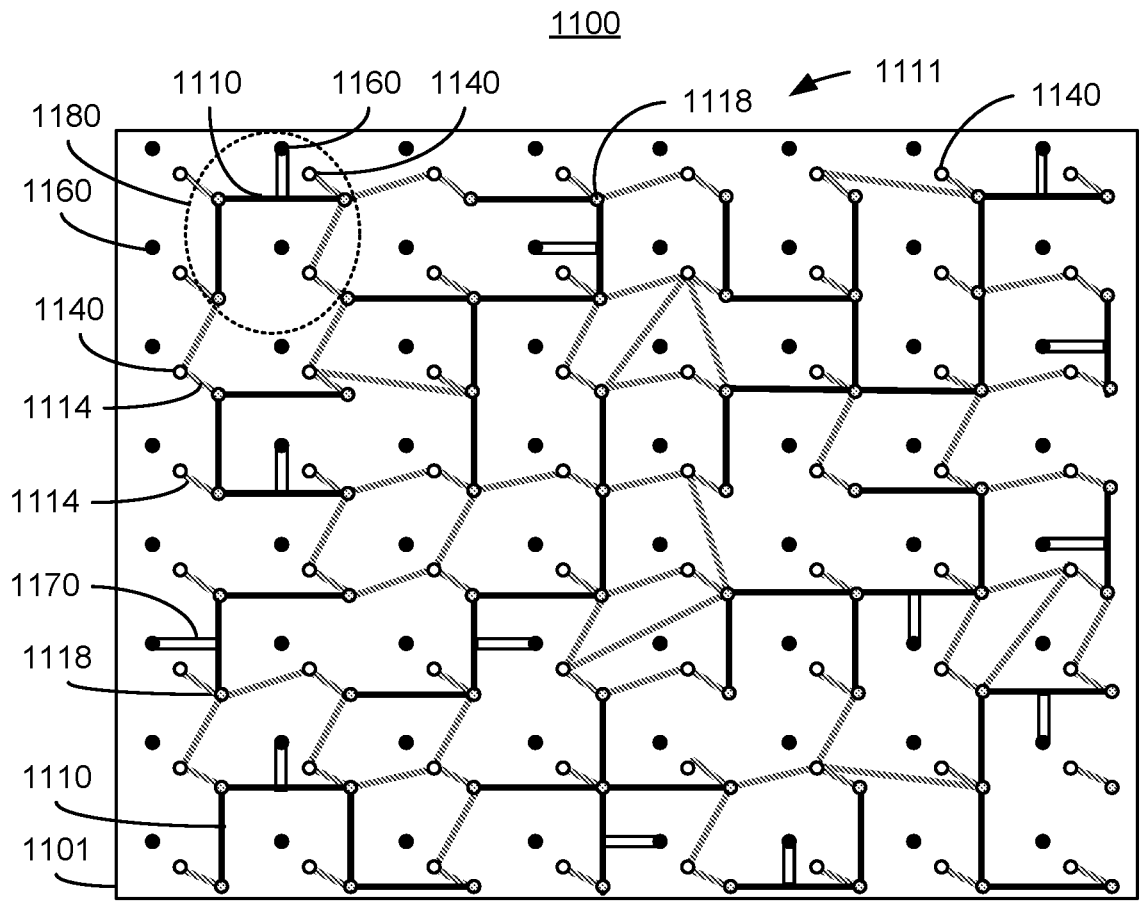
FIG. 12 is diagram depicting an embodiment of a portion of a device including a sparsely connected neural array.

Conductive interlayer connectors may also be used for other and/or additional purposes in some applications. For example, FIG. 12 is a plan view of an embodiment of a device 1100 including a sparsely connected neural array. For clarity, only a portion of memristive device 1100 is shown and FIG. 12 is not to scale. For simplicity, only some structures are labeled. In FIG. 12, a single layer 1111 is shown. Memristive device 1100 may include multiple layers. For example, additional layers that are analogous to layer 1111 (and/or other layers described) may be included. However, such layers may have conductive pathways (i.e. geometries of various components) that differ from those of layer 1111. Some or all of the components of memristive device 1100 may be lithographically fabricated as discussed with respect to memristive devices 100, 100', 200, 300, 400, 500, 600, 700, 800, 900, and 1000.

In device 1100, connection is made to neurons (not shown) that may reside below or above the layer 1111 shown. For example, neurons may reside below the portion of device 1100 shown. Thus, a cross sectional view of the underlying layers may include devices that are analogous to devices 106 and 108 of FIG. 1C.

Device 1100 includes insulator 1101, conductive interlayer connectors 1160 (black circles, of which only some are labeled), memristive interlayer connectors 1140 (white circles, of which only one is labeled), and conductive lines 1110 (formed from black line segments, of which only some are labeled). Conductive interlayer connectors 1160 and memristive interlayer connectors 1140 may be viewed as forming a rectangular (e.g. square) lattice of connections to underlying (or overlying) neurons. In other embodiments, a different lattice may be used. Conductive interlayer connectors 1160 are analogous to conductive interlayer connector 1060. Thus, a conductive interlayer connector 1160 does not include a memristive shell or analogous component. Consequently, direct electrical contact may be made to conductive interlayer connector 1160. Electrical contact between conductive interlayer connectors 1160 and conductive lines 1110 is made via conductive branch segments 1170 (white segments outlined in black, of which only some are labeled). Conductive branch segments 1170 are analogous to conductive branch structures 1114, but connect conductive lines 1110 to conductive interlayer connectors 1160. In some embodiments, conductive interlayer connectors 1160 are electrically connected to input neurons (not shown in FIG. 12) that may be under layer 1111.

Memristive interlayer connectors 1140 are analogous to one or more of memristive interlayer connectors 140, 240, 340, 440, 540, 640, 740, 840, 940 and/or 1040. Thus, memristive interlayer connectors 1140 are memristively coupled to conductive lines 1110. In the embodiment shown, memristive interlayer connectors 1140 are memristively coupled to conductive lines 1110 by conductive branch structures 1114 (gray line segments, of which only some are labeled). Conductive branch structures 1114 are analogous to conductive branch structure(s) 714, 814, 914, and/or 1014. In other embodiments, connection between memristive interlayer connectors 1140 and conductive lines 1110 may be made in another manner. For example, conductive lines 1110 and memristive interlayer connectors 1140 may be memristively connected via direct contact, as shown in FIGS. 1A-1D. In some embodiments, memristive interlayer connectors 1140 are coupled to output neurons (not shown in FIG. 12), that may be under layer 1111.

Segments of conductive lines 1110 are connected or terminate at nodes 1118 (gray circles, of which only some are labeled). Nodes 1118 are formed of a conductor, such as a metal (e.g. Cu). Conductive lines 1110 formed of such segments may have arbitrary shapes and may be considered clusters. For example, one cluster 1180 including conductive lines 1110 (black line segments) is enclosed in dashed line 1180 in FIG. 11. Other clusters are not labeled for clarity. Conductive lines 1110 are sparsely connected with (and via) memristive interlayer connectors 1140 and conductive interlayer connectors 1160. In the embodiment shown, each cluster 1180 is coupled with one conductive interlayer connector 1160 and multiple memristive interlayer connectors 1140. Thus, each cluster 1180 is connected with one input neuron and memristively connected with multiple output neurons. In other embodiments, other connectivity is possible.

Conductive interlayer connectors 1160 extend through insulator 1101 and any desired underlying (or overlying) layers to input neurons. In some embodiments, each conductive interlayer connector 1160 is electrically connected to one input neuron. Memristive interlayer connectors 1140 extend through insulator 1101 and any desired underlying (or overlying) layers to output neurons. In some embodiments, each memristive interlayer connector 1140 is connected to one output neuron. Thus, the neurons to which connectors 1140 and 1160 provide electrical coupling can be viewed as being partitioned into input neurons (connected to conductive interlayer connectors 1160) and output neurons (connected to memristive interlayer connectors 1140). In some embodiments, the roles of conductive interlayer connectors 1160 and memristive interlayer connectors 1140 may be switched. Thus, memristive interlayer connectors 1140 may be electrically connected to input neurons, while interlayer connectors 1160 are electrically connected to output neurons in such embodiments. Conductive interlayer connectors 1160 may also correspond to memristive interlayer connectors 1140. For example, in the embodiment shown, conductive interlayer connectors 1160 and memristive interlayer connectors 1140 occur in pairs. In some embodiments, there need not be a one-to-one correspondence between conductive interlayer connectors 1160 and memristive interlayer connectors 1140.

In memristive device 1100, individual memristors (i.e. weights to output neurons) may be individually addressed. Stated differently, the resistances for individual memristors (the portion of the memristive interconnect 1140 for a particular layer) can be individually programmed. For example, in labeled cluster 1180, the corresponding conductive line 1110, conductive branch structure 1114 (not labeled within labeled cluster 1180), and conductive interlayer connector 1160 can be considered a node (all at the same electrical potential/shorted). Individual voltage differences can be established between conductive interlayer connector 1160 within labeled cluster 1180 and any of the directly connected memristive interlayer connectors 1140 (of which only one is labeled for labeled cluster 1180). For example, a voltage of zero volts may be connected to an input neuron (i.e. conductive interlayer connector 1160 of labeled cluster 1180) and a voltage of four volts may be connected to labeled memristive interlayer connector 1140 (and thus the corresponding output neuron) for cluster 1180. Current flows through conductive lines 1110 and memristive portion of memristive interlayer connector 1140 is programmed to the corresponding weight. A similar procedure may be carried out to program weights for other memristive interlayer connectors 1140 in labeled cluster 1180. Weights (resistances of memristors) can be programmed for other output neurons coupled with other clusters 1180 in an analogous fashion. Thus, in memristive device 1100, memristive devices formed through memristive interlayer connectors 1140 may be individually programmed.

Further, memristive device 1100 can provide a variety of types of sparse connectivity (e.g. very sparse, denser sparse, local/short-range connectivity, long-range connectivity) between input neurons and output neurons. Although only one layer 1111 is shown, some embodiments may include multiple layers having different configurations of lattices, conductive lines 1110, clusters 1180 and/or connections to connectors 1140 and/or 1160. Thus, varying connectivity and a high flexibility in connection patterns may be provided. This allows for a high flexibility in the connection patterns that may be formed. A range from very sparse to very dense (though possibly still sparse) connectivity may be provided between and within layers. Further, the regularity (or irregularity and randomness) of layer 1111 and thus memristive device 1100 may be controlled. Because memristors are formed for memristive interlayer connectors 1160, individual control over all memristors may be provided in the network of layer 1111. Further, formation of conductive lattice clusters 1180, and thus the degree and type of connectivity, may be controlled. Thus, fabrication and repeatability of the formation of devices 1100 may be improved. In some embodiments, fully parallel convolutions might be possible. Consequently, performance of devices employing such sparsely connected arrays of neurons may be improved.

FIGS. 13A-13E are diagrams depicting an embodiment of a portion of device 1200 including a sparse neural array during fabrication. For clarity, only a portion of memristive device 1200 (i.e. a single layer) is shown and FIGS. 13A-13E are not to scale. For simplicity, only some structures are labeled. Memristive device 1200 is analogous to memristive device 1100. Memristive device 1200 may be formed using method 580 and is described in the context of method 580. However, other techniques may be used in forming memristive device 1100.

Figure 13A:
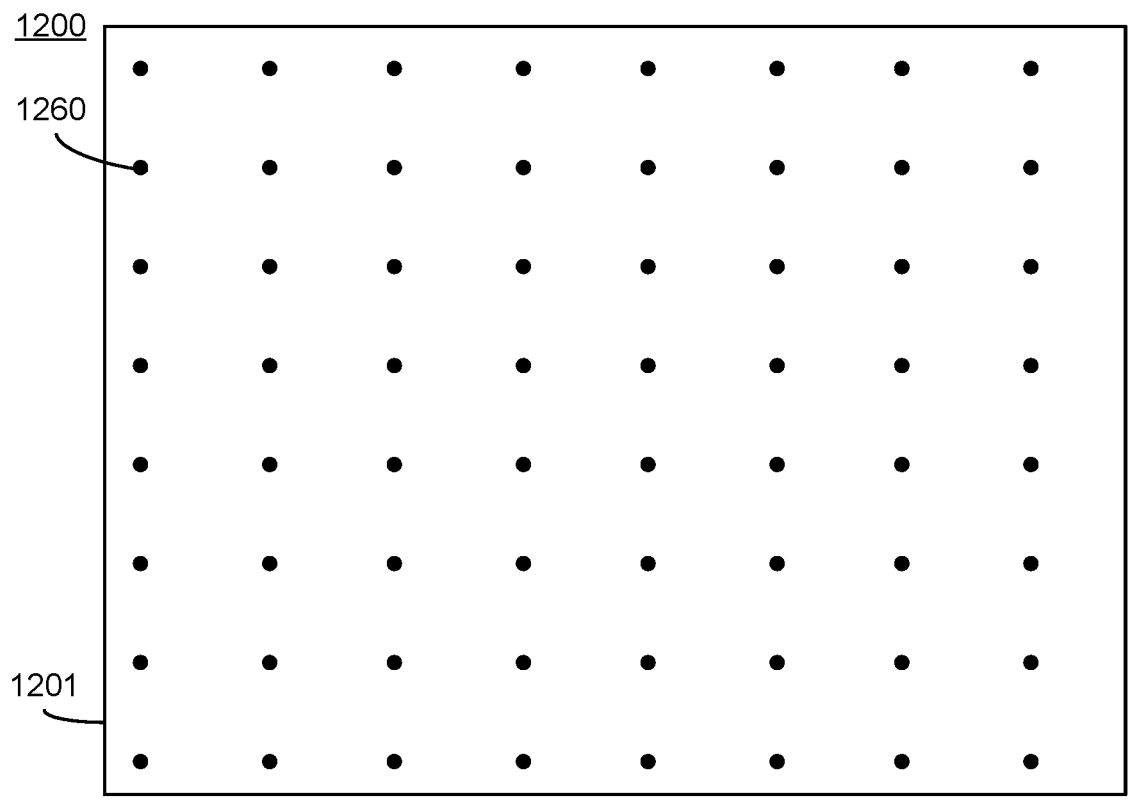
FIGS. 13A-13E are diagrams depicting an embodiment of a device including a sparse neural array during fabrication.

FIG. 13A depicts device 1200 after formation of conductive interlayer connectors 1260 (black circles of which only one is labeled) through insulator 1201, using 590 of method 580. Conductive interlayer connectors 1260 are thus lithographically fabricated. Conductive interlayer connectors 1260 are analogous to conductive interlayer connectors 1160. In some embodiments, metal pillars are grown vertically through all intervening layer(s) and connect to input neurons. For example, conductive interlayer connectors 1260 may connect to the axons of input neurons in CMOS below the layer shown.

Figure 13B:
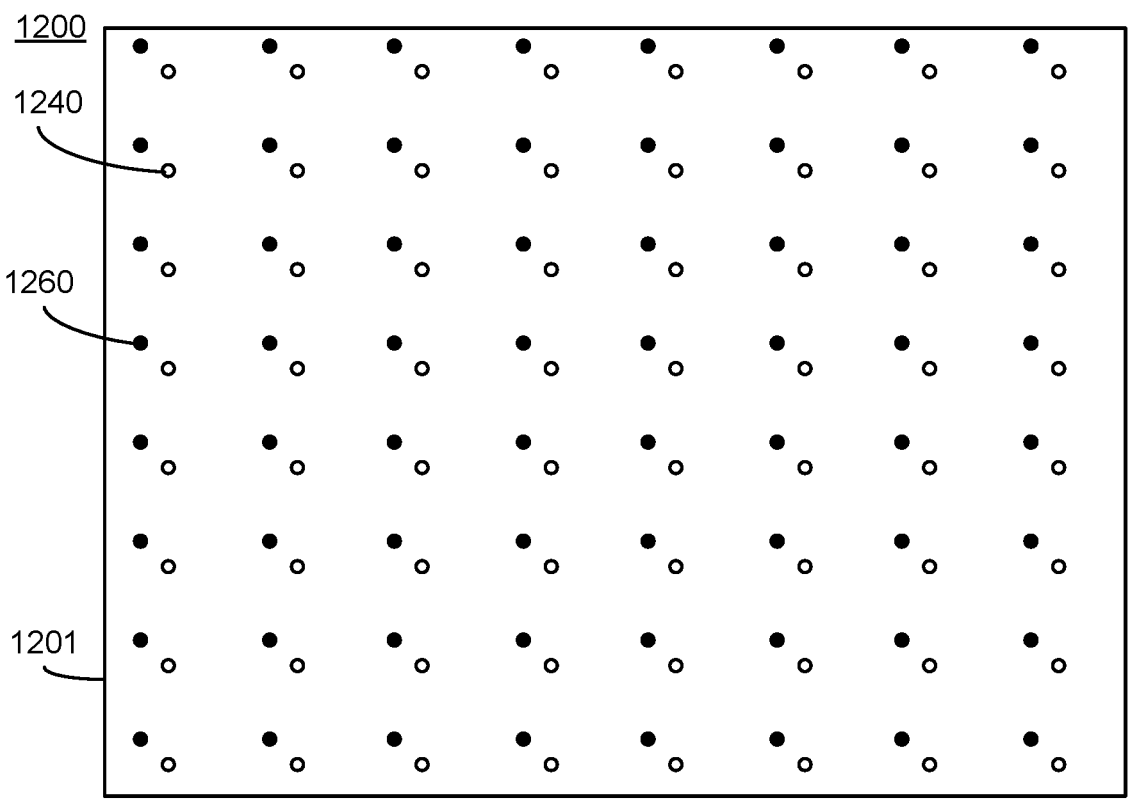

FIG. 13B depicts device 1200 after formation of memristive interlayer connectors 1240 (white circles of which only one is labeled) through insulator 1201, using 588 of method 580. Thus, memristive interlayer connectors are lithographically provided. Memristive interlayer connectors 1240 are analogous to memristive interlayer connectors 1140. In some embodiments, 588 includes etching vias through layers (including insulating layer 1201), growing memristive layer(s) coating the vias vertically through all intervening layer(s), and providing the conductive (e.g. metal) pillars to connect to output neurons. For example, memristive interlayer connectors 1240 may connect to the dendrites of output neurons in node CMOS below the layer shown. Thus, through memristive interlayer connectors 1240, other components may be memristively connected to output neurons.

Figure 13C:
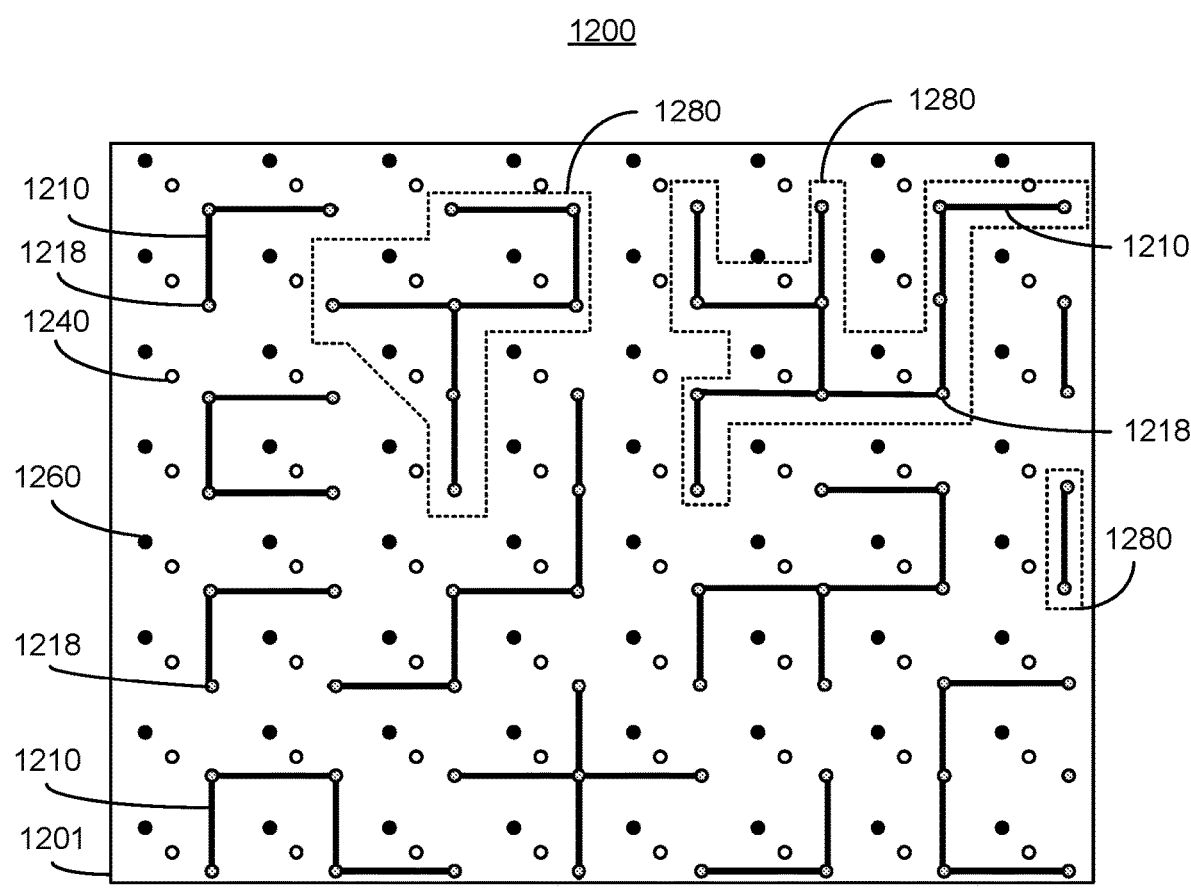

FIG. 13C depicts device 1200 after formation of a lattice of conductive lines 1210 that provides inter-neuron connectivity, at 582 of method 580. Conductive lines 1210 may be lithographically formed and are analogous to conductive lines 1110. The lattice includes segments (black lines) of conductive lines 1210 formed on a rectangular lattice and which form conductive lattice clusters 1280 (of which only three are labeled and enclosed in dashed lines). The segments are terminated in and/or connected by nodes 1218 in the embodiment shown. In some embodiments, the conductive lines 1210 including nodes 1218 are metal. Embodiments/regions having a low segment density may create many clusters that can be used to form local connections. Embodiments/regions having a high segment density may create fewer clusters that can be used to form long-range connections. Although segments of conductive lines 1210 are shown as formed as a square lattice, other lattices are possible. For example, segments of conductive line(s) 1210 may be formed on a diagonal and connected by nodes 1218.

Figure 13D:
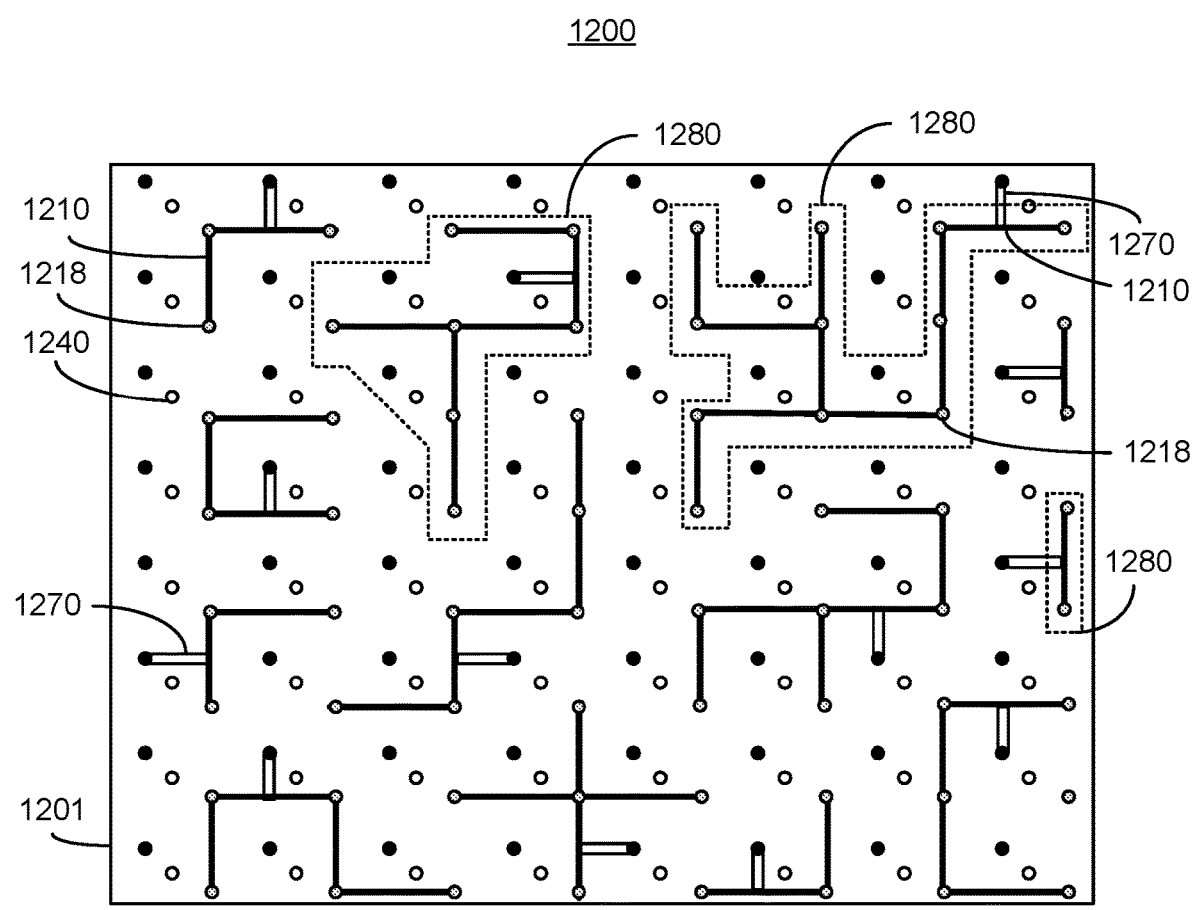

FIG. 13D depicts device 1200 after formation of conductive branch segments 1270 (white rectangles, of which only one is labeled). Conductive branch segments 1270 are analogous to conductive branch segments 1170, may be metal lines, and are connected to input neurons. Conductive branch segments 1270 may thus be considered input lines. In some embodiments, fabrication of conductive branch segments 1270 may be considered part of forming conductive lines 1210 using 582 of method 580. In other embodiments, fabrication of conductive branch segments 1270 may be considered part of forming conductive interlayer connectors 1260 using 590 of method 580. In some embodiments, therefore, conductive branch segments 1270 are lithographically formed. Conductive lattice clusters 1280 are connected to conductive interlayer connectors 120 through input conductive branch segments 1270. In the embodiment shown, only one conductive interlayer connector 1260, and thus only one input neuron, is connected to each conductive lattice cluster 1280.

Figure 13E:
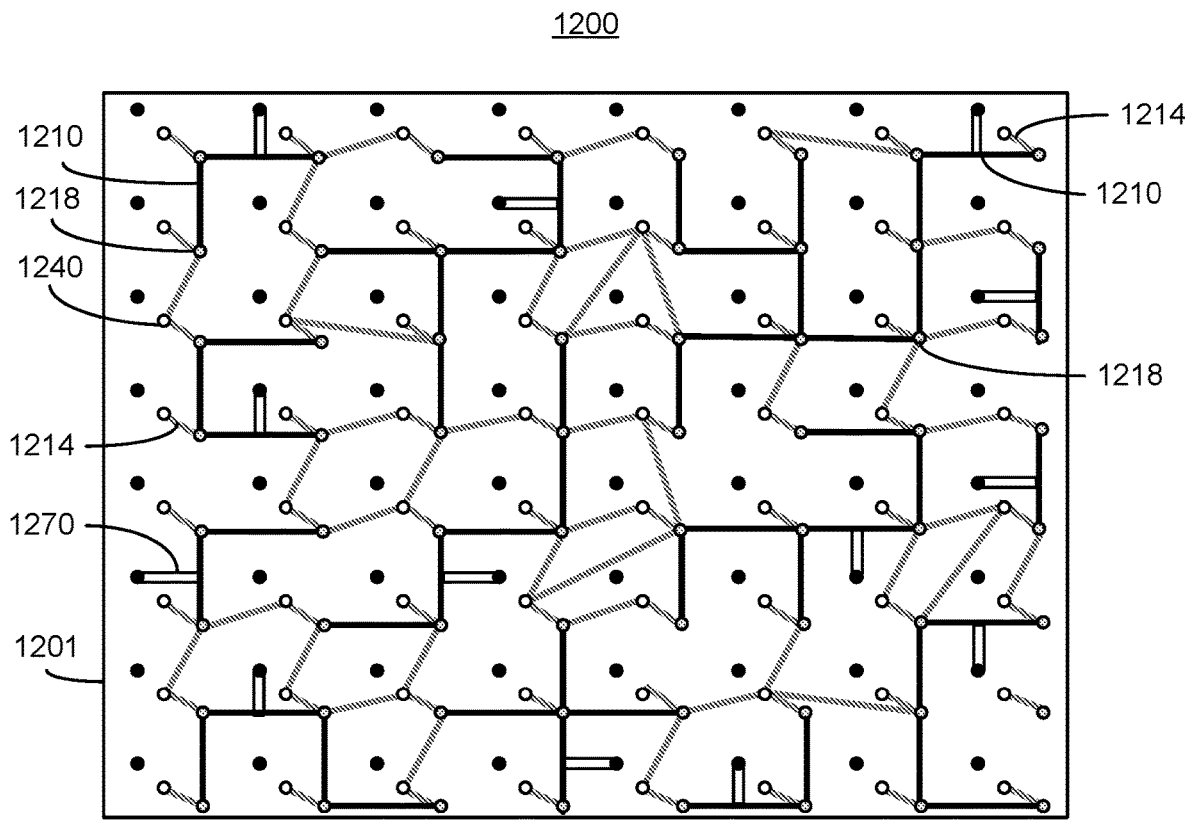

FIG. 13E depicts device 1200 after formation of conductive branch structures 1214 (gray lines, of which only some are labeled). Conductive branch structures 1214 are analogous to conductive branch structures 1114, may be metal lines, and are connected to output neurons. Thus, conductive branch structures may be considered output lines. In some embodiments, fabrication of conductive branch structures 1214 may be considered part of forming conductive lines 1210 using 582 of method 580. In other embodiments, fabrication of branch structures 1214 may be considered part of forming memristive interlayer connectors 1240 using 588 of method 580. In some embodiments, therefore, branch structures 1214 are lithographically formed. Conductive lattice clusters 1280 are connected to memristive interlayer connectors 1240 through conductive branch structures 1214. In the embodiment shown, multiple memristive interlayer connectors 1240, and thus multiple output neurons, are connected to each conductive lattice cluster 1280. In some embodiments, up to four connections per output neuron per layer are allowed. In such embodiments, therefore, a particular memristive interlayer connector 1240 may be connected to not more than four (i.e. 1, 2, 3 or 4) conductive lattice clusters 1280.

An analogous process may be repeated for additional layers, using 584 and 586 of method 580. Different conductive lattice clusters (e.g. different segments and/or different configurations of segments) may be formed for each additional layer of connections. There may be no overlap between layers. Varying densities of connections/lattice clusters between layers may be used to create both short-range and long-range connections.

Memristive device 1200 is analogous to and shares the benefits of memristive device 1100. Thus, memristive device 1200 allow for individual memristors (i.e. weights to output neurons) to be individually addressed. Thus, the resistances for individual memristors (the portion of the memristive interconnect 1240 in a particular layer) can be individually programmed. Further, memristive device 1200 can provide a variety of types of sparse connectivity (e.g. very sparse, denser sparse, local/short-range connectivity, long-range connectivity) between input neurons and output neurons. Memristive device may include multiple layers having different configurations of lattices, conductive lines 1210, clusters 1280 and/or connections to connectors 1240 and/or 1260. Thus, varying connectivity and a high flexibility in connection patterns may be provided. Further, individual layers of memristive devices 1200 are deterministically and repeatably fabricated via lithography. The regularity (or irregularity and randomness) memristive device 1200 may be controlled. Thus, fabrication and repeatability of the formation of devices 1200 may be improved. Consequently, performance of devices employing memristive device 1200 may be improved.

Figure 14:
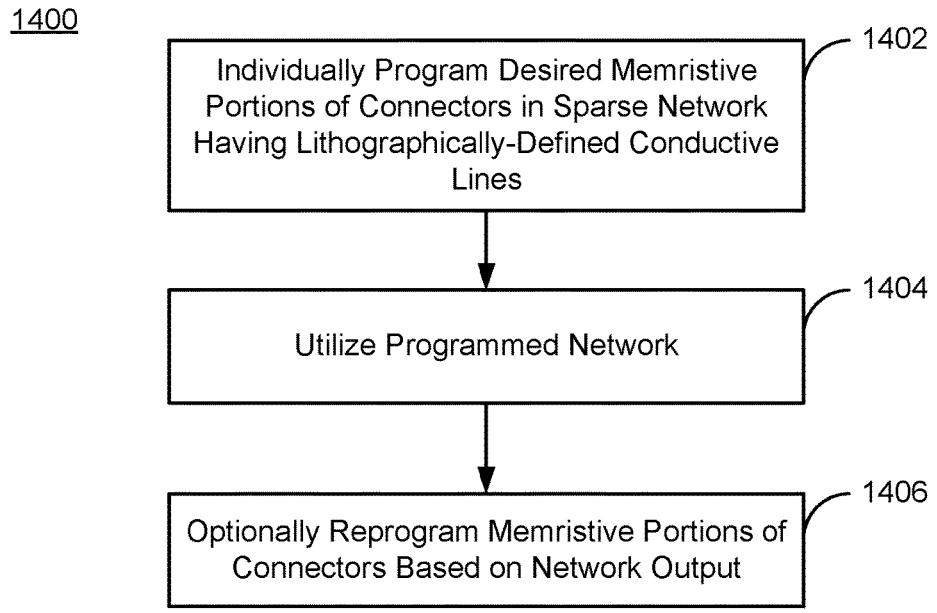
FIG. 14 is a flow-chart depicting an embodiment of a method for using a sparsely connected neural array.

FIG. 14 is a flow-chart depicting an embodiment of method 1400 for using a sparsely connected neural array. For clarity, only some steps are shown. Other and/or additional procedures may be carried out in some embodiments. Although described in the context of a flow, processes in method 1400 may be carried out in parallel and/or may be interleaved.

Memristors are individually programmed, at 1402. For example, a conductive line in a memristive device is accessed by applying a voltage to a conductive portion of a memristive interlayer connector, at 1402. In addition, a voltage is applied to a node coupled with the conductive line, also at 1402. This may include applying a voltage to a conductive interlayer connector coupled to the conductive line. This procedure is repeated until all desired memristors are programmed to the appropriate weights. The neural network or other device incorporating the memristors may then be utilized, at 1404. Based on the resultant output, new weights may be desired for some or all of the memristors in the device. Consequently, some or all of the memristors may be reprogrammed, at 1406. The procedures carried out for 1406 are analogous to those for 1402. 1404 and 1406 may be repeated until the desired output is achieved.

For example, in device 1100, different voltages may be applied to conductive interlayer connector 1160 of labeled cluster 1180 and to labeled memristive interlayer connector 1140 of labeled cluster 1180, at 1402. Current flows through conductive lines 1110 and memristive portion of memristive interlayer connector 1140 is programmed to the corresponding weight. A similar procedure may be carried out to program weights for other memristive interlayer connectors 1140 in labeled cluster 1180 and the remaining portions of memristive device 1100 also at 1402. Thus, the desired weights (resistances of memristors) can be programmed individually programmed for memristive device 1100. Memristive device 1100 is then utilized as 1404. Based on the output, the memristors for one or more of memristive interlayer connector(s) 1140 may be reprogrammed, at 1406. Thus, the desired weights for memristive device 1100 may be determined and individually provided. Using method 1400, the advantages of memristive device 1100 may be achieved and performance of devices employing memristive device 1100 may be improved.

Although the foregoing embodiments have been described in some detail for purposes of clarity of understanding, the invention is not limited to the details provided.

There are many alternative ways of implementing the invention. The disclosed embodiments are illustrative and not restrictive.

What is claimed is:

1. A memristive device, comprising:
   a first layer including a first plurality of conductive lines, the first plurality of conductive lines being lithographically defined such that the first plurality of conductive lines are parallel;
   a second layer including a second plurality of conductive lines, the second layer being different from the first layer, the second plurality of conductive lines being insulated from the first plurality of conductive lines, the second plurality of conductive lines being lithographically defined such that the second plurality of conductive lines are parallel and are at a first nonzero acute angle from the first plurality of lines;
   a third layer including a third plurality of conductive lines, the third layer being different from the first layer and from the second layer, the third plurality of conductive lines being insulated from the second plurality of conductive lines, the third plurality of conductive lines being lithographically defined such that the third plurality of conductive lines are parallel, are at a second nonzero acute angle from the second plurality of lines, and are at a nonzero angle from the first plurality of lines; and
   a plurality of memristive interlayer connectors being memristively coupled with a first portion of the first plurality of conductive lines, memristively coupled with a second portion of the second plurality of conductive lines, and memristively coupled with a third portion of the third plurality of lines, such that the plurality of memristive interlayer connectors are sparsely coupled with the first plurality of conductive lines, sparsely coupled with the second plurality of conductive lines, and sparsely coupled with the third plurality of conductive lines, each of the plurality of memristive interlayer connectors including a conductive portion and a memristive portion, the memristive portion residing between the conductive portion and at least one corresponding line of at least one of the first plurality of conductive lines or of the second plurality of conductive lines, the plurality of memristive interlayer connectors being lithographically defined and intersecting the first portion of the first plurality of conductive lines, the second portion of the second plurality of conductive lines, and the third portion of the third plurality of conductive lines, the first layer, the second layer, the third layer, and the plurality of memristive interlayer connectors forming at least one sparsely coupled irregular network.

2. The memristive device of claim 1, wherein the first plurality of conductive lines have a first long axis oriented in a first direction, the second plurality of conductive lines have a second long axis oriented in a second direction, the first direction being at the first nonzero acute angle from the second direction.

3. The memristive device of claim 1, wherein the first plurality of conductive lines has a first connectivity, the second plurality of conductive lines has a second connectivity and the memristive device has a third connectivity less than the first connectivity and less than the second connectivity.

4. The memristive device of claim 1, further comprising:
   a plurality of conductive interlayer connectors corresponding to the plurality of memristive interlayer connectors, the plurality of conductive interlayer connectors being electrically connected to a third portion of the first plurality of conductive lines and being electrically connected to a fourth portion of the second plurality of conductive lines.

5. The memristive device of claim 4, further comprising:
   a plurality of input neurons coupled to at least a portion of the plurality of conductive interlayer connectors; and
   a plurality of output neurons coupled to at least a portion of the plurality of memristive interlayer connectors.

6. The memristive device of claim 4, wherein at least one of the third portion of the first plurality of conductive lines and the fourth portion of the second plurality of conductive lines include a plurality of clusters.

7. The memristive device of claim 1, wherein at least one of the first plurality of conductive lines and the second plurality of conductive lines are electrically floating.

8. The memristive device of claim 1, wherein the conductive portion is a conductive pillar having a sidewall; and
   wherein the memristive portion surrounds at least a portion of the sidewall.

9. The memristive device of claim 1, wherein each of at least one of the first portion of the first plurality of conductive lines and the second portion of the second plurality of conductive lines is coupled to the plurality of memristive interlayer connectors by a conductive branch structure.

10. The memristive device of claim 9, wherein the memristive portion of each of the plurality of memristive interlayer connectors includes a memristive layer in proximity to the conductive branch structure.

11. The memristive device of claim 1, wherein at least a portion of the first plurality of conductive lines are randomly connected to at least a portion of the second plurality of conductive lines through the plurality of memristive interlayer connectors.

12. A neural network, comprising:
    a first layer including a first plurality of conductive lines, the first plurality of conductive lines being lithographically defined such that the first plurality of conductive lines are parallel;
    a second layer including a second plurality of conductive lines, the second layer being different from the first layer, the second plurality of conductive lines being insulated from the first plurality of conductive lines, the second plurality of conductive lines being lithographically defined such that the second plurality of conductive lines are parallel and are at a first nonzero acute angle from the first plurality of lines;
    a third layer including a third plurality of conductive lines, the third layer being different from the first layer and from the second layer, the third plurality of conductive lines being insulated from the second plurality of conductive lines, the third plurality of conductive lines being lithographically defined such that the third plurality of conductive lines are parallel are at a second nonzero acute angle from the second plurality of lines, and are at a nonzero angle from the first plurality of lines;
    a plurality of memristive interlayer connectors being memristively coupled with a first portion of the first plurality of conductive lines, memristively coupled with a second portion of the second plurality of conductive lines, and memristively coupled with a third portion of the third plurality of lines, such that the plurality of memristive interlayer connectors are sparsely coupled with the first plurality of conductive lines, sparsely coupled with the second plurality of conductive lines, and sparsely coupled with the third plurality of conductive lines, each of the plurality of memristive interlayer connectors including a conductive portion and a memristive portion, the memristive portion residing between the conductive portion and at least one corresponding line of at least one of the first plurality of conductive lines or of the second plurality of conductive lines, the plurality of memristive interlayer connectors being lithographically defined and intersecting the first portion of the first plurality of conductive lines, the second portion of the second plurality of conductive lines, and the third portion of the third plurality of conductive lines, the first layer, the second layer, the third layer, and the plurality of memristive interlayer connectors forming at least one sparsely coupled irregular network; and a plurality of neurons coupled to the plurality of memristive interlayer connectors;

wherein the first plurality of predetermined positions, the second plurality of predetermined positions, and the plurality of predetermined connector locations are configured such that the first layer, the second layer, and the plurality of memristive interlayer connectors form at least one sparsely coupled irregular network.

13. A method, comprising:

lithographically defining a first plurality of conductive lines in a first layer such that the first plurality of conductive lines are parallel;

lithographically defining a second plurality of conductive lines in a second layer, the second layer being different from the first layer, the second plurality of conductive lines being insulated from the first plurality of conductive lines such that the second plurality of conductive lines are parallel and are at a first nonzero acute angle from the first plurality of lines;

lithographically defining a third layer including a third plurality of conductive lines, the third layer being different from the first layer and from the second layer, the third plurality of conductive lines being insulated from the second plurality of conductive lines, the third plurality of conductive lines being lithographically defined such that the third plurality of conductive lines are parallel, are at a second nonzero acute angle from the second plurality of lines, and are at a nonzero angle from the first plurality of lines; and providing a plurality of memristive interlayer connectors memristively coupled with a first portion of the first plurality of conductive lines, memristively coupled with a second portion of the second plurality of conductive lines, and memristively coupled with a third portion of the third plurality of lines, such that the plurality of memristive interlayer connectors are sparsely coupled with the first plurality of conductive lines and sparsely coupled with the second plurality of conductive lines, each of the plurality of memristive interlayer connectors including a conductive portion and a memristive portion, the memristive portion residing between the conductive portion and at least one corresponding line of at least one of the first plurality of conductive lines or of the second plurality of conductive lines, the plurality of memristive interlayer connectors being lithographically defined and intersecting the first portion of the first plurality of conductive lines, the second portion of the second plurality of conductive lines, and the third portion of the third plurality of conductive lines, the first layer, the second layer, the third layer, and the plurality of memristive interlayer connectors forming at least one sparsely coupled irregular network.

14. The method of claim 13, wherein the lithographically defining the first plurality of conductive lines further includes:

defining a first long axis oriented in a first direction for the first plurality of conductive lines; and wherein the lithographically defining the second plurality of conductive lines further includes defining a second long axis oriented in a second direction, the first direction being at the nonzero acute angle from the second direction.

15. The method of claim 13, wherein each conductive line of at least one of the first plurality of conductive lines and the second plurality of conductive lines includes a plurality of line segments having a plurality of long axes oriented in a plurality of directions.

16. The method of claim 13, further comprising:

providing a plurality of conductive interlayer connectors corresponding to the plurality of memristive interlayer connectors, the plurality of conductive interlayer connectors being electrically connected to a third portion of the first plurality of conductive lines and being electrically connected to a fourth portion of the second plurality of conductive lines.

17. The method of claim 16, further comprising:

providing a plurality of input neurons coupled to at least a portion of the plurality of conductive interlayer connectors; and providing a plurality of output neurons coupled to at least a portion of the plurality of memristive interlayer connectors.

18. The method of claim 17, wherein at least one of the third portion of the first plurality of conductive lines and the fourth portion of the second plurality of conductive lines include a plurality of clusters.

19. The method of claim 13, wherein at least one of the first plurality of conductive lines and the second plurality of conductive lines are electrically floating.

* * * * *